United States Patent
Choi

(10) Patent No.: US 7,463,535 B2
(45) Date of Patent: Dec. 9, 2008

(54) MEMORY MODULES AND MEMORY SYSTEMS HAVING THE SAME

(75) Inventor: Joo-Sun Choi, Gyeonggi-do (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 84 days.

(21) Appl. No.: 11/379,345

(22) Filed: Apr. 19, 2006

(65) Prior Publication Data

US 2007/0086228 A1 Apr. 19, 2007

(30) Foreign Application Priority Data

May 21, 2005 (KR) .................. 10-2005-0042789

(51) Int. Cl.
 *G11C 7/10* (2006.01)
(52) U.S. Cl. .................. 365/189.04; 365/189.01; 365/230.01; 365/230.05
(58) Field of Classification Search ............ 365/230.03, 365/189.04, 230.05, 230.01, 189.01
 See application file for complete search history.

(56) References Cited

U.S. PATENT DOCUMENTS

| | | | |
|---|---|---|---|
| 5,590,078 A | 12/1996 | Chatter | |
| 5,870,350 A | 2/1999 | Bertin et al. | |
| 6,088,774 A * | 7/2000 | Gillingham | 711/167 |
| 7,102,907 B2 * | 9/2006 | Lee et al. | 365/63 |
| 7,173,877 B2 * | 2/2007 | Ruckerbauer et al. | 365/233 |
| 7,180,821 B2 * | 2/2007 | Ruckerbauer et al. | 365/221 |
| 7,289,347 B2 * | 10/2007 | Taylor | 365/64 |

FOREIGN PATENT DOCUMENTS

KR 2004-0106198 12/2004

OTHER PUBLICATIONS

English language abstract of Korean Publication No. 2004-0106198.

* cited by examiner

*Primary Examiner*—Pho M. Luu
(74) *Attorney, Agent, or Firm*—Marger Johnson & McCollom, P.C.

(57) ABSTRACT

A memory module includes a port configured to receive write data and command/address signals and multiple memory devices. The multiple memory devices include a first set of the memory devices, each memory device of the first set coupled to the port, and a second set of the memory devices, each memory device of the second set configured to receive associated write data and associated command/address signals for the memory device through at least one of the other memory devices of the first set and the second set.

33 Claims, 25 Drawing Sheets

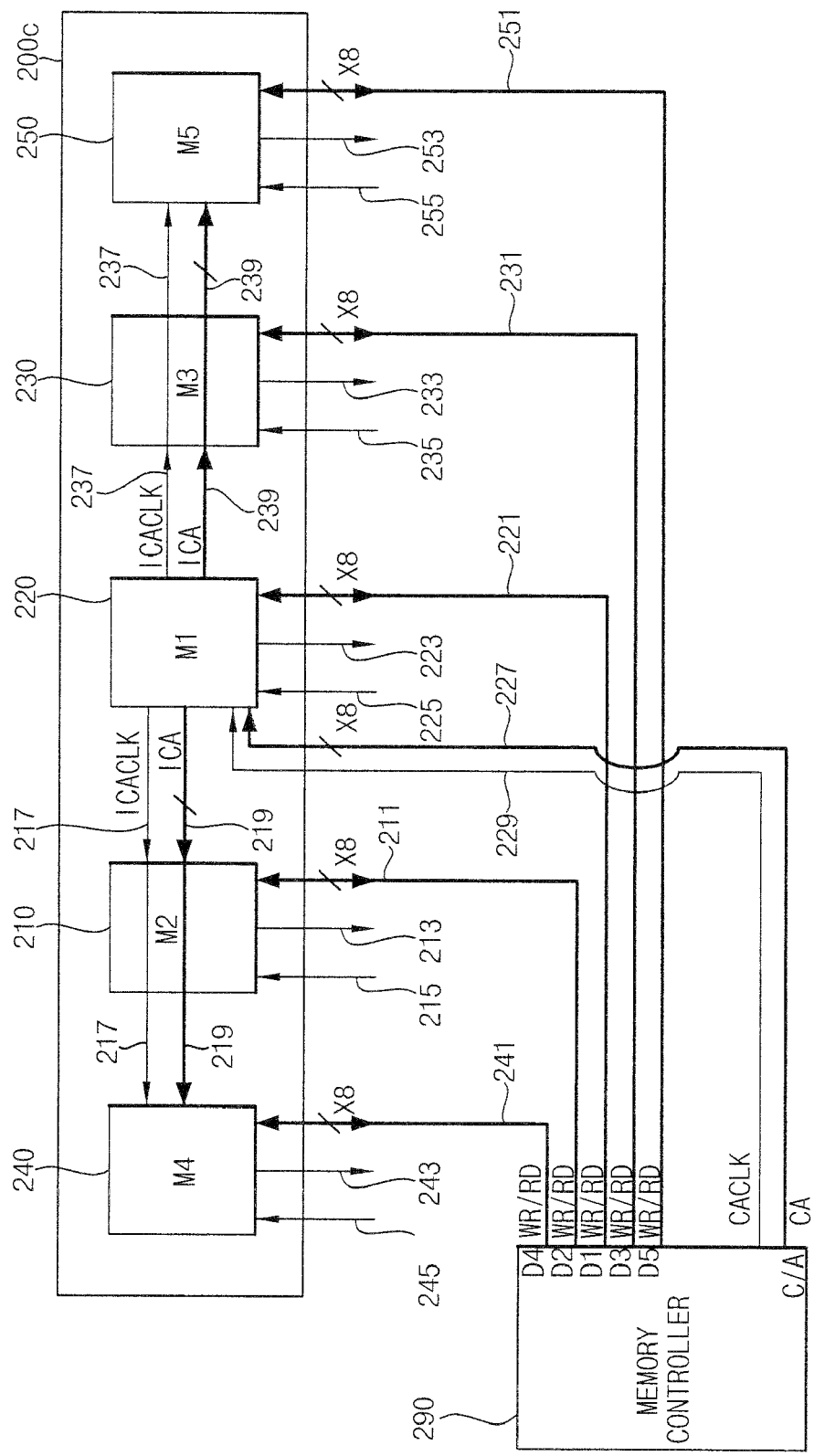

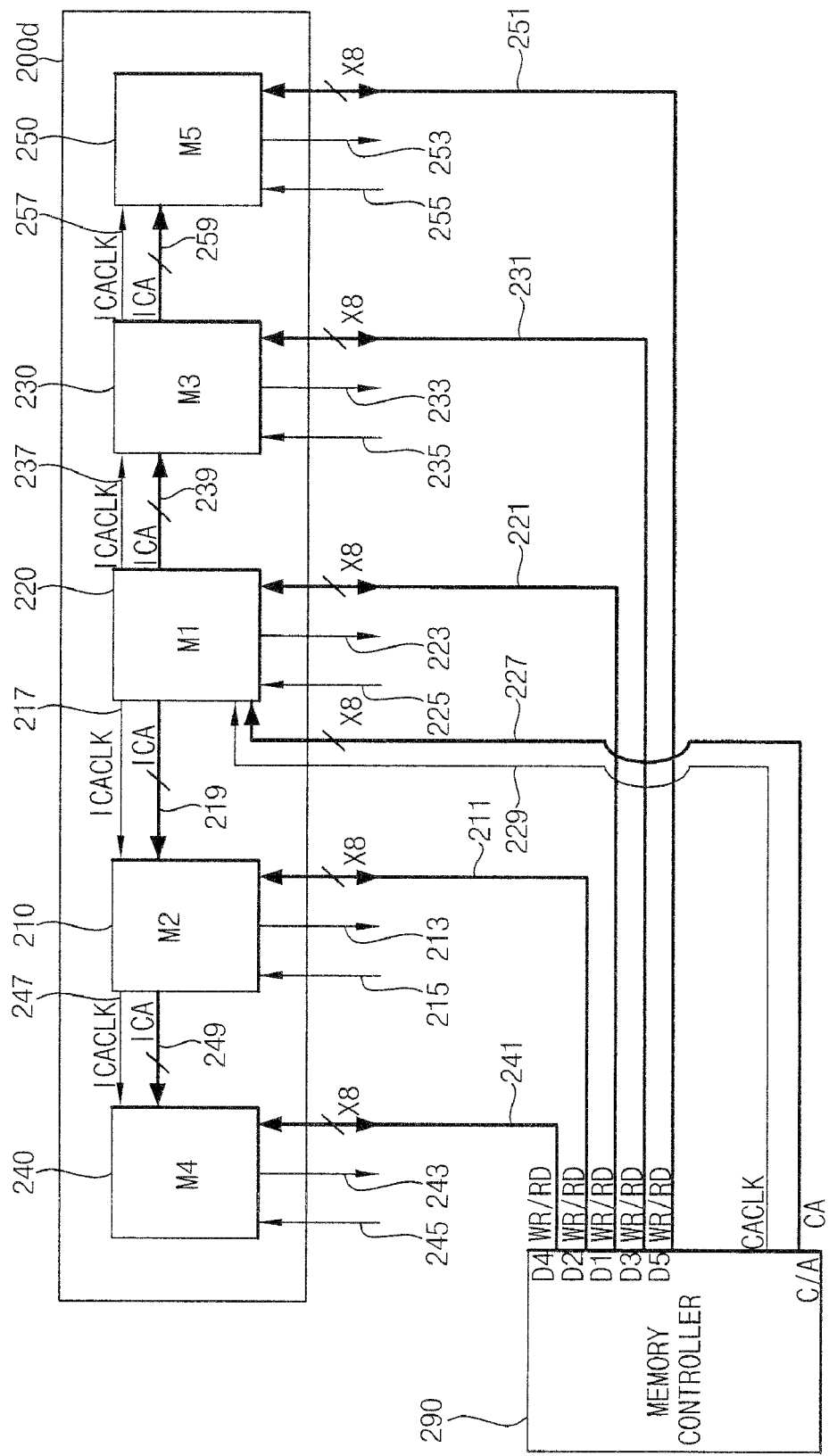

MEMORY MODULES AND MEMORY SYSTEMS HAVING THE SAME

CLAIM FOR PRIORITY

This application claims priority to Korean Patent Application No. 2005-42789 filed on May 21, 2005 in the Korean Intellectual Property Office (KIPO), the entire contents of which are hereby incorporated by reference.

BACKGROUND

1. Technical Field

This disclosure relates to memory modules and memory systems having the same, and more particularly to memory modules operating at high operating clock frequencies and memory systems having the same.

2. Description of the Related Art

FIG. 1 is a block diagram illustrating a conventional memory module. FIG. 1 shows a memory module having eight×8 dynamic random access memory (DRAM) devices.

Referring to FIG. 1, a command/address bus 12 (CA) is split to be coupled to each of the eight DRAM devices 20-1 to 20-8. Eight read/write data buses 14 (DQ) are respectively coupled to the eight DRAM devices 20-1 to 20-8.

As an operating speed of memory devices increases, it becomes more difficult for the memory devices to share a command/address bus CA and a read/write data bus due to the capacitive loading of input/output (I/O) lines of the memory devices. Conventional synchronous dynamic random access memory (SDRAM) modules and double data rate (DDR) memory modules, with operating speeds in a range from 100 MHz to 800 MHz, may have a multi-drop configuration in which a command/address bus CA is simultaneously coupled to eight or nine DRAM devices.

A memory module 10 may have about 20 command/address pins, 64 (8×8) data pins, about 60 power pins, and a few other pins for specific functions. For example, a memory module with SDRAM devices may have 168 pins. With DDR memory devices, the memory module may have 184 pins. With DDR2 memory devices, the memory module may have 232 pins.

As memory devices evolve, operating speeds supported by the memory devices may increase. In addition, the number of pins may increase. For example, a maximum data transfer rate of a DDR3 memory is about 1,600 Mbps. A next-generation memory developed after the DDR3 memory may have a data transfer rate of about 3,200 Mbps. However, the next generation memory may not stably receive or transmit in noisy environments if using conventional single-ended signaling in which one data bit is received or transmitted using one data pin. Specifically, when memory devices have an operating clock frequency over one GHz, a desired signal integrity (SI) may not be achieved due to capacitive loads of nodes (i.e., nodes coupled to the memory devices).

A next generation memory device may use differential signaling, in which one data bit is received or transmitted using two data pins. Differential signaling may be needed to support a data transfer rate of more than about 3,200 Mbps.

However, a memory module that uses differential signaling requires twice as many pins as those of a memory module that uses single ended signaling because two data pins are required to transmit or receive one bit. For example, when there are 64 data lines, as shown in FIG. 1, 128 data pins are required to transmit or receive 64 data bits. It is currently difficult to design a memory module having more than 250 pins due to current personal computer (PC) design limits and associated mechanical limits. Thus, it is difficult to design the memory module using the differential signaling due to the increase of the number of pins.

When the number of memory devices included in a memory module is reduced so as to avoid the design limits restricting the number of pins in a memory module, data throughput of a memory module decreases.

In addition, in the conventional memory module configuration, the number of pins of a memory module is increased in a circumstance where a first memory module couples to a second memory module via a point-to-point connection so as to reduce the effect of the capacitive loads for the purpose of high-speed operation.

Therefore, it is difficult to use conventional memory modules having conventional command/address bus architecture and the conventional data bus architecture in next generation DRAM having differential signaling and operating at a clock frequency of a few GHz.

SUMMARY

An embodiment includes a memory module including a port configured to receive write data and command/address signals and multiple memory devices. The multiple memory devices include a first set of the memory devices, each memory device of the first set coupled to the port, and a second set of the memory devices, each memory device of the second set configured to receive associated write data and associated command/address signals for the memory device through at least one of the other memory devices of the first set and the second set.

Another embodiment includes a memory module including a command/address port configured to receive command/address signals and multiple memory devices. The multiple memory devices include a first set of the memory devices, each memory device of the first set coupled to the command/address port, and a second set of the memory devices, each memory device of the second set configured to receive associated command/address signals through at least one of the other memory devices of the first set and the second set.

A further embodiment includes a memory system including multiple memory modules, with each memory module including a command/address port configured to receive command/address signals, a first set of memory devices, each memory device of the first set coupled to the command/address port, and a second set of memory devices, each memory device of the second set configured to receive associated command/address signals through at least one of the other memory devices of the first set and the second set. Each of the memory devices of the first and second sets is coupled to a corresponding memory device of another memory module by an associated data bus.

BRIEF DESCRIPTION OF THE DRAWINGS

Embodiments will be described in detail with reference to the accompanying drawings, in which:

FIGS. 2A through 2D are block diagrams illustrating memory systems according to an embodiment;

DETAILED DESCRIPTION

Figure 1:
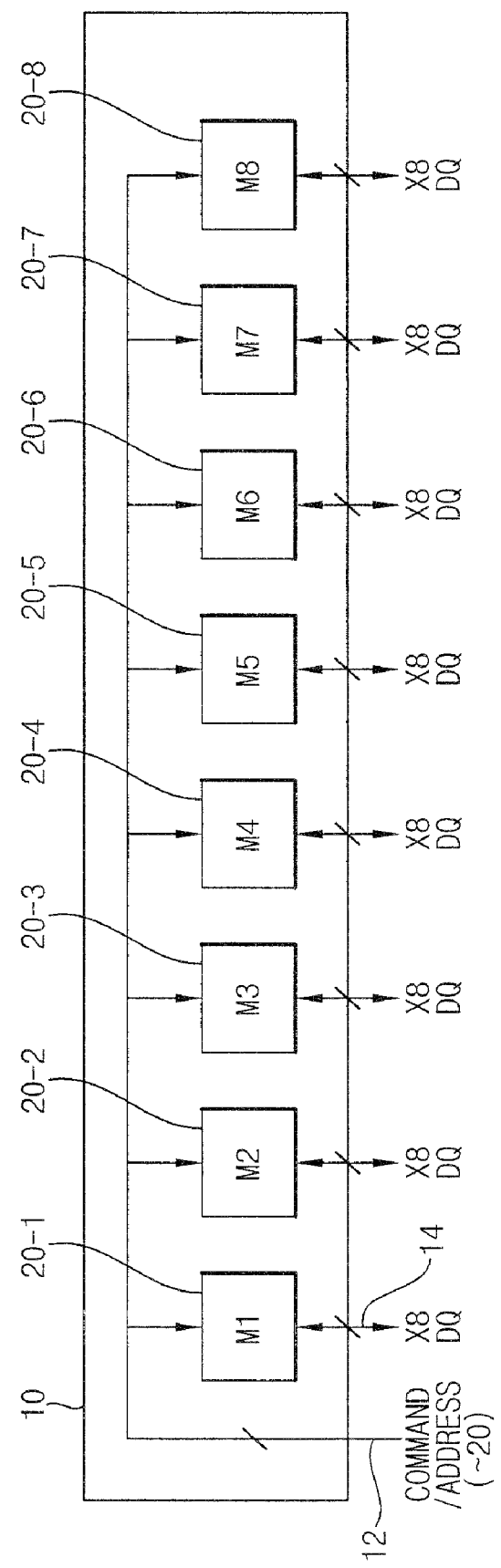
FIG. 1 is a block diagram illustrating a conventional memory module.

Embodiments are disclosed herein. However, specific structural and functional details disclosed herein are merely representative for purposes of describing the embodiments. The embodiments may take many alternate forms and should not be construed as limited to the embodiments set forth herein.

Accordingly, while the embodiments are susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention. Like numbers refer to like elements throughout the description of the figures.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments and is not intended to be limiting of the invention. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments are discussed under a circumstance in which data signals output from a plurality of data ports of a memory controller are respectively coupled to a corresponding memory device via a point-to-point connection through multiple data buses. A command/address signal output from a port of a memory controller is directly transferred to at least one memory device of a memory module through a command/address bus, and then is transferred to the other memory devices of the memory module via the memory device that is directly coupled to the memory controller.

Figure 2A:
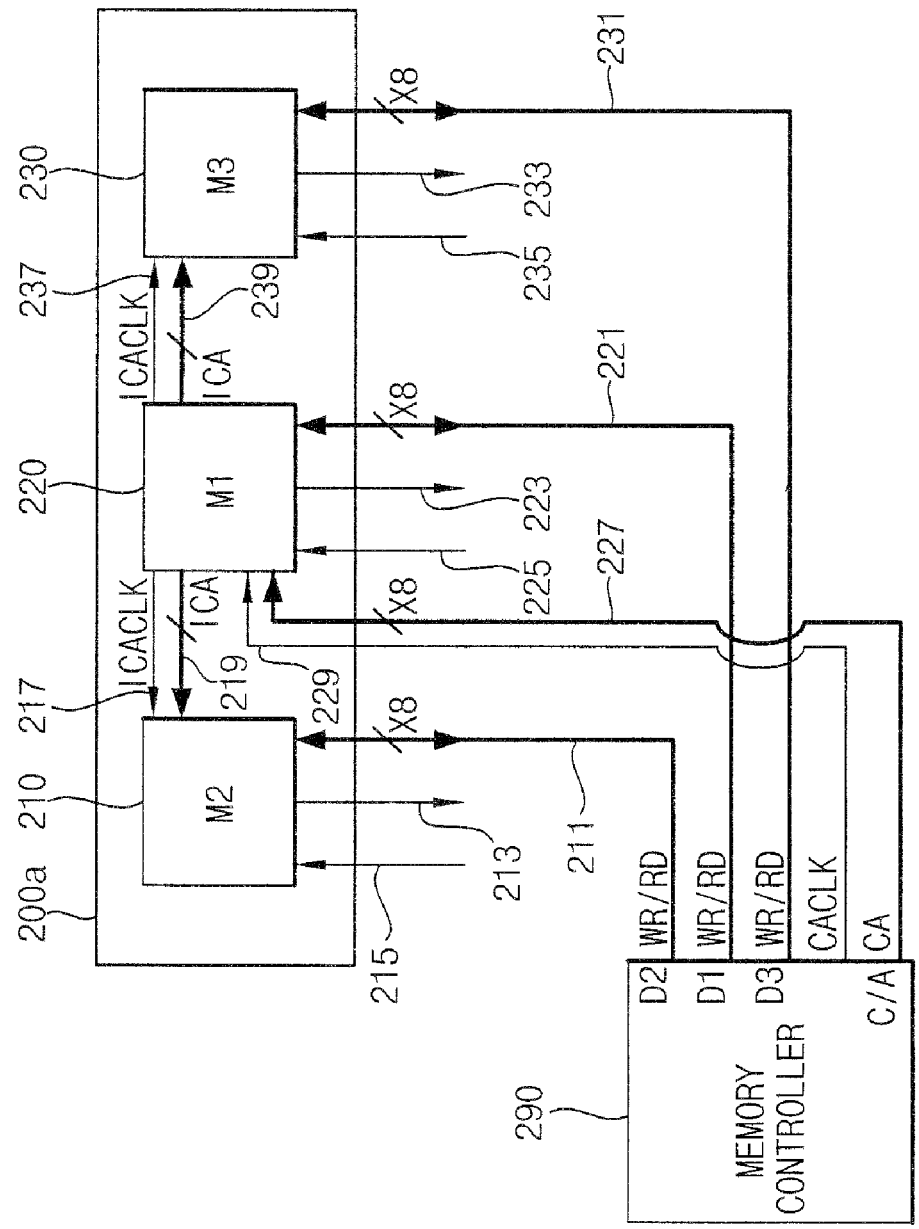
Figure 2B:
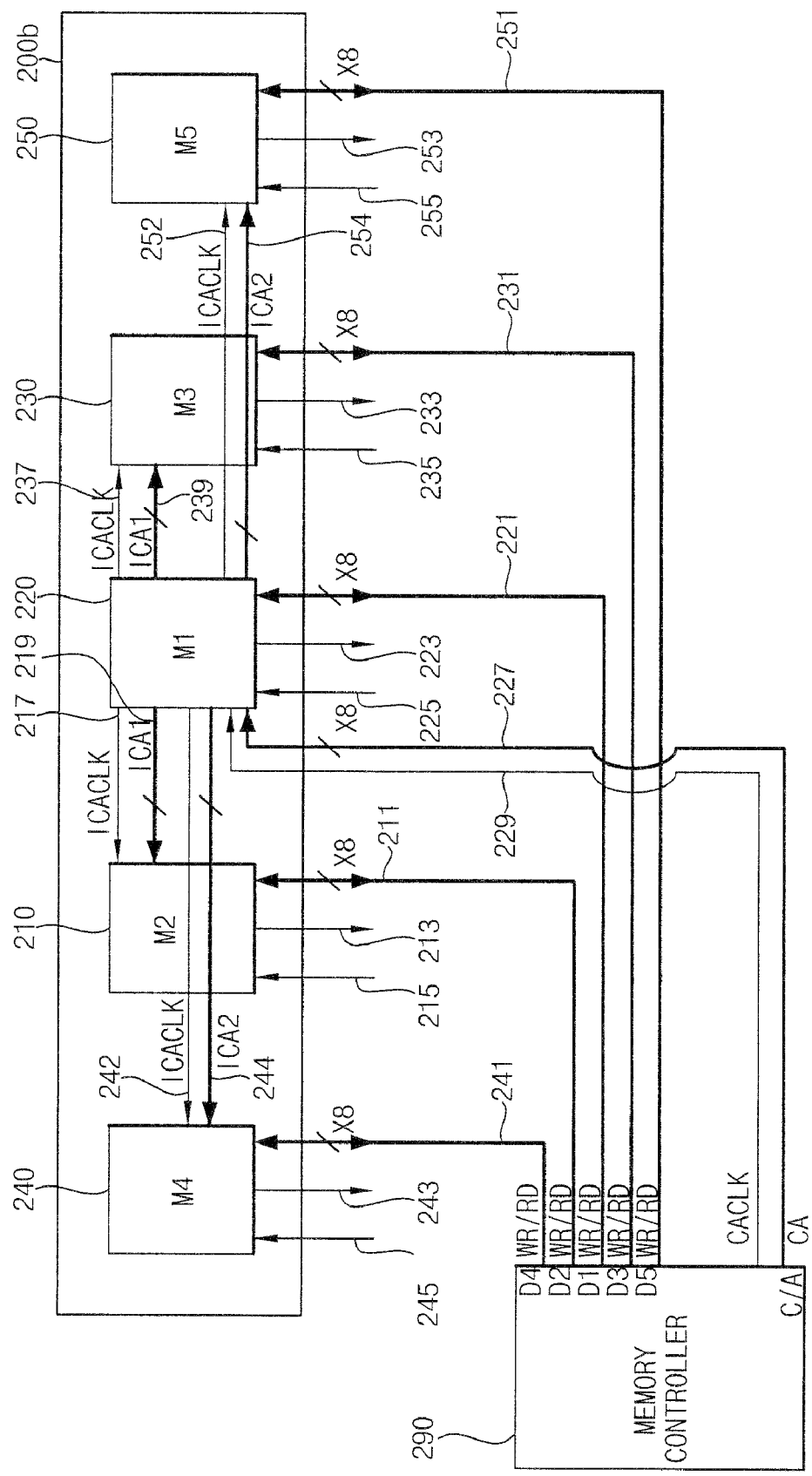
Figure 3:
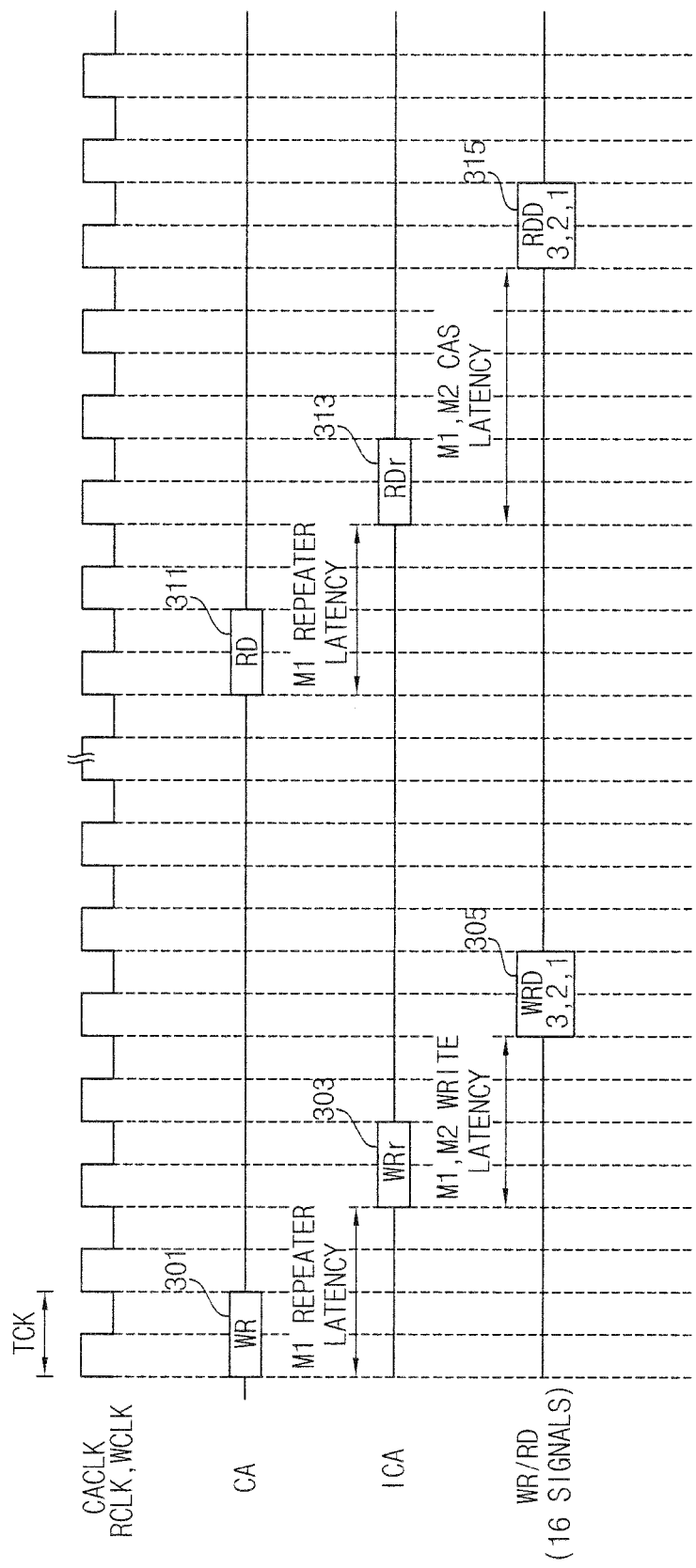
FIG. 3 is a timing diagram illustrating write and read operations of a memory module of FIG. 2A.
Figure 4:
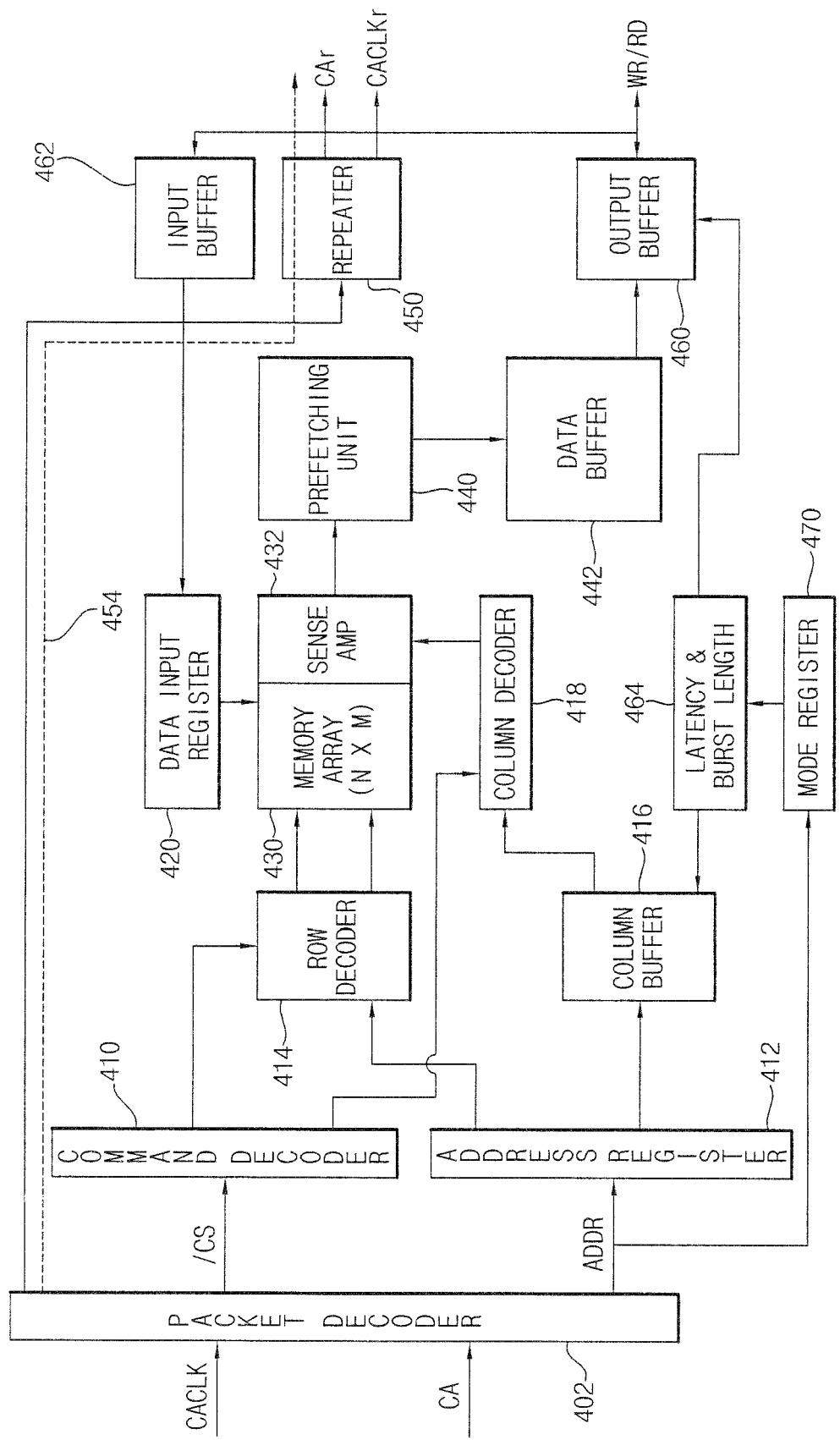
FIG. 4 is a block diagram illustrating a memory device in memory modules of FIGS. 2A through 2D.

FIGS. 2A through 2D are block diagrams illustrating memory systems according to embodiments, FIG. 3 is a timing diagram illustrating write and read operations of a memory module of FIG. 2A, and FIG. 4 is a block diagram illustrating a memory device in memory modules of FIGS. 2A through 2D.

Referring to FIG. 2A, the memory system includes a memory module 200a and a memory controller 290. In this embodiment, data ports and command/address ports of the memory controller 290 and memory devices respectively have 8 pins. However, in this and other embodiments, data ports and command/address ports may have more or less than 8 pins as desired.

The data ports D1, D2 and D3 of the memory controller 290 are coupled to the memory devices 220, 210 and 230 (M1, M2 and M3), respectively, through a data bus WR/RD via a point-to-point connection. The data bus 221 coupled to the data port D1 of the memory controller 290 is directly coupled to the memory device M1, the data bus 211 coupled to the data port D2 of the memory controller 290 is directly coupled to the memory device M2, and the data bus 231 coupled to the data port D3 of the memory controller 290 is directly coupled to the memory device M3.

Although not shown in FIG. 2A, write clock buses 215, 225 and 235 (WCLK) and read clock buses 213, 223, 233 (RCLK) of the memory controller 290 are coupled to the memory devices M2, M1 and M3, respectively, via a point-to-point connection. Write data or read data are transferred through the data bus WR/RD, and thus data transfer of the data bus WR/RD is bidirectional.

The command/address signal output from the command/address port C/A of the memory controller 290 is directly coupled to the memory device M1 via the command/address bus 227. The command/address signal is repeated by a repeater 450 (refer to FIG. 4) in the memory device 220, and is transferred to other memory devices 210 and 230 inside the memory module through internal command/address buses 219 and 239 (ICA), respectively. For example, the command/address signal input to the memory device M1 is transferred to other memory devices M2 and M3 by the repeater in the memory device M1.

The command/address signal may be packet data that include address information and an operand representing a command, such as a read command and a write command, etc. The command/address signal may be transferred as packet data through the command/address bus 227. The command/address signal may be unidirectionally transferred through the command/address bus 227.

The command/address clock signal CACLK is provided to the memory device M1 via the command/address clock bus 229, is repeated by the repeater 450 in the memory device 220, and is transferred to other memory devices 210 and 230 inside the memory module through internal command/address clock buses 217 and 237 (ICACLK), respectively.

For example, the memory devices 220, 210, 230, 240 and 250 of FIG. 2A through 2D, respectively, may be implemented to have the configuration of the memory device in FIG. 4.

The repeater 450 is activated when the memory device 220 repeats the command/address signal, and is not activated when the memory device 220 does not repeat the command/address signal.

For example, the repeaters of the memory devices 210 and 230 of FIGS. 2A, 2B and 2C are not activated because the memory devices 210 and 230 of FIGS. 2A, 2B and 2C do not perform the repeat function on the command/address signal. The repeaters of the memory devices 210 and 230 of FIG. 2D are activated during repeating the command/address signal because the memory devices 210 and 230 of FIG. 2D perform the repeat function on the command/address signal.

Hereinafter, referring to FIGS. 3 and 4, the write and read operations of a memory module (for example, the memory module 200a of FIG. 2A) are explained.

Referring to FIG. 3, the command/address signals 301 and 311 are input to the memory device 220 through the command/address bus 227 in response to the command/address clock signal CACLK. The command/address signal 301 includes data write command WR and address information. The command/address signal 311 includes data read command RD and address information. The command/address signals 301 and 311 may be packet data.

The command/address signals 301 and 311 are input to a packet decoder 402 in the memory device 220, and are transferred through a command/address bypass path 454. After a delay due to the command/address bypass path 454, the command/address signals 301 and 311, passed through the bypass path 454, are input into the repeater 450, and are repeated by the repeater 450 in the memory device 220. The command/address signals 301 and 311 passed through the bypass path 454 may still have a packet format. The command/address signals 303 and 313 (WRr and RDr) repeated by the repeater 450 are transferred to the memory devices M2 and M3 through the ICA bus.

In a write operation, the memory controller 290 provides the write data WRD1, WRD2 and WRD3 to the memory devices M1, M2 and M3, respectively, through the data buses 221, 211 and 231 (WR/RD) in response to the write clock WCLK. The memory controller 290 may simultaneously apply the write data WRD1, WRD2 and WRD3 to the data buses 221, 211 and 231. Alternatively, the memory controller 290 may sequentially apply the write data WRD1, WRD2 and WRD3 to the data buses 221, 211 and 231. Although the memory controller 290 provides the write data WRD1, WRD2 and WRD3 a predetermined time period after an input of the repeated command/address signals 303 and 313 (WRr and RDr) in FIG. 3, the predetermined time period may vary depending upon write latency.

The write data 305 (WRD1, WRD2 and WRD3) are input to input buffers 462 of the memory devices 220 and 230, and are written into memory array 430 of a corresponding memory device through a data input register 420.

In a read operation, the command/address signal 313 including a read command is repeated by the repeater of the memory device M1, and the read data RDD3, RDD2 and RDD1 are output to the memory controller 290 through the data buses 231, 211 and 221 in response to the RCLK after a predetermined time period (i.e., a column address strobe latency through the memory devices 220, 210 and 230).

FIG. 2B represents a memory system including five memory devices.

Referring to FIG. 2B, the memory system includes a memory module 200b and a memory controller 290. The memory module 200b has memory devices M1 through M5. For example, data ports and command/address ports of the memory controller 290 respectively have 8 pins.

The data ports D1, D2, D3, D4 and D5 of the memory controller 290 are coupled to the memory devices 220, 210, 230, 240 and 250 (M1, M2, M3, M4 and M5), respectively, through data buses 221, 211, 231, 241 and 251 via a point-to-point connection. Although not shown in FIG. 2B, write clock buses 215, 225, 235, 245 and 255 (WCLK) and read clock buses 213, 223, 233, 243 and 253 (RCLK) of the memory controller 290 are coupled to the memory devices M2, M1, M3, M4 and M5, respectively, via a point-to-point connection.

The command/address signal is repeated by a repeater 450 (refer to FIG. 4) in the memory device M1 disposed in the middle of the memory module 200b, and is transferred to memory devices M2 and M4, which are disposed adjacent to a first side of the memory device M1, and memory devices M3 and M5, which are disposed adjacent to a second side of the memory device M1.

Particularly, the command/address signal output from the command/address port C/A of the memory controller 290 is coupled to the memory device M1 through the command/address bus 227. The repeaters in the memory devices M2 and M3 receive the command/address signal repeated by the memory device M1 through a command/address bus ICA1, and the repeaters in the memory device M4 and M5 receive the command/address signal repeated by the memory device M1 through a command/address bus ICA2.

As shown in FIG. 2B, the command/address bus ICA1 and the command/address bus ICA2 may be separately managed so as to reduce latency required for re-driving the command/address signal.

Here, the command/address signal may be transferred as packet data through the command/address bus 227. The command/address signal may be unidirectionally transferred through the command/address bus 227.

Alternatively, the memory device M2, M3, M4 or M5 other than the memory device M1 may receive the command/address signal from the memory controller 290 and re-drive the received command/address signal to retransmit the repeated command/address signal to another memory device.

The command/address clock signal CACLK is provided to the memory device M1 via the command/address clock bus 229 from the memory controller 290, is repeated by the repeater 450 in the memory device 220, and is transferred to the memory devices 210 and 230 inside the memory module 200d through internal command/address clock buses 217 and 237 (ICACLK), respectively. In addition, the command/address clock signal CACLK repeated by the repeater 450 of the memory device 220 is transferred to the memory devices 240 and 250 through the internal command/address clock buses 242 and 252 (ICACLK), respectively.

FIG. 2C represents a memory system according to another embodiment.

Referring to FIG. 2C, the command/address signal is repeated by the repeater of the memory device M1, and is transferred to the memory devices M2 and M4 through a common command/address bus (ICA) 219 and is transferred to the memory devices M3 and M5 through a common command/address bus (ICA) 239. By using the common command/address bus (ICA), the number of memory pins may be reduced.

In addition, the command/address clock signal is repeated by the repeater in the memory device M1, and transferred to the memory devices M2 and M4 through a common command/address clock bus (ICACLK) 217 and transferred to the memory devices M4 and M5 through a common command/address clock bus (ICACLK) 237. By using the common command/address clock signal bus (ICACLK), the number of memory pins may be reduced. That is, the memory device M1 may transfer the command/address signal and/or command/address clock signal to another memory device such as memory device M2, M3, M4 or M5 through a common memory pin, thereby reducing the number of memory pins.

FIG. 2D represents a memory system according to another embodiment.

Referring to FIG. 2D, the memory system includes a memory module 200b and a memory controller 290. The memory module 200b has memory devices M1 through M5. For example, data ports and command/address ports of the memory controller 290 respectively have 8 pins.

The data ports D1, D2, D3, D4 and D5 of the memory controller 290 are coupled to the memory devices 220, 210, 230, 240 and 250 (M1, M2, M3, M4 and M5), respectively, through data buses 221, 211, 231, 241 and 251 via a point-to-point connection. Although not shown in FIG. 2D, write clock buses 215, 225, 235, 245 and 255 (WCLK) and read clock buses 213, 223, 233, 243 and 253 (RCLK) of the memory controller 290 are coupled to the memory devices M2, M1, M3, M4 and M5, respectively, via a point-to-point connection.

The command/address signal is repeated by the repeater 450 in the memory device M1 of the memory module 200d, and is transferred to memory devices M2 and M3. Memory devices M2 and M3 are disposed adjacent to the memory device M1. The command/address signal repeated by the repeater 450 in the memory devices M2 and M3 is transferred to the memory devices M4 and M5, disposed adjacent to the memory devices M2 and M3, respectively. The memory devices M1, M2, M3, M4 and M5 of the memory module 220d are coupled to one another via a point-to-point connection.

Particularly, the repeater in the memory device M2 receives the command/address signal repeated by the memory device M1, and transfers the received command/address signal to the memory device M4 adjacent to the memory device M2. The repeater in the memory device M3 receives the command/address signal repeated by the memory device M1, and transfers the received command/address signal to the memory device M5 adjacent to the memory device M3.

The command/address clock signal CACLK is provided to the memory device M1 via the command/address clock bus 229 from the memory controller 290, is repeated by the repeater 450 in the memory device M1, and is transferred to the other memory devices M2 and/or M3 of the memory module 200d through internal command/address clock buses 217 and 237 (ICACLK), respectively. The memory devices M2 and/or M3 transfers the command/address clock signal CACLK to memory devices M4 and M5 of the memory module 200d through internal command/address clock buses 247 and 257 (ICACLK), respectively.

FIG. 4 shows an example of internal blocks of a dynamic random access memory (DRAM) device having n×m memory cells. Although the above embodiment shows a configuration of the internal blocks of a DRAM device, any configuration of a memory device having at least one repeater and bypass path, or any other configuration known to one of ordinary skill in the art may also be utilized in place of the configuration of the internal blocks of the DRAM device of FIG. 4.

Figure 5:
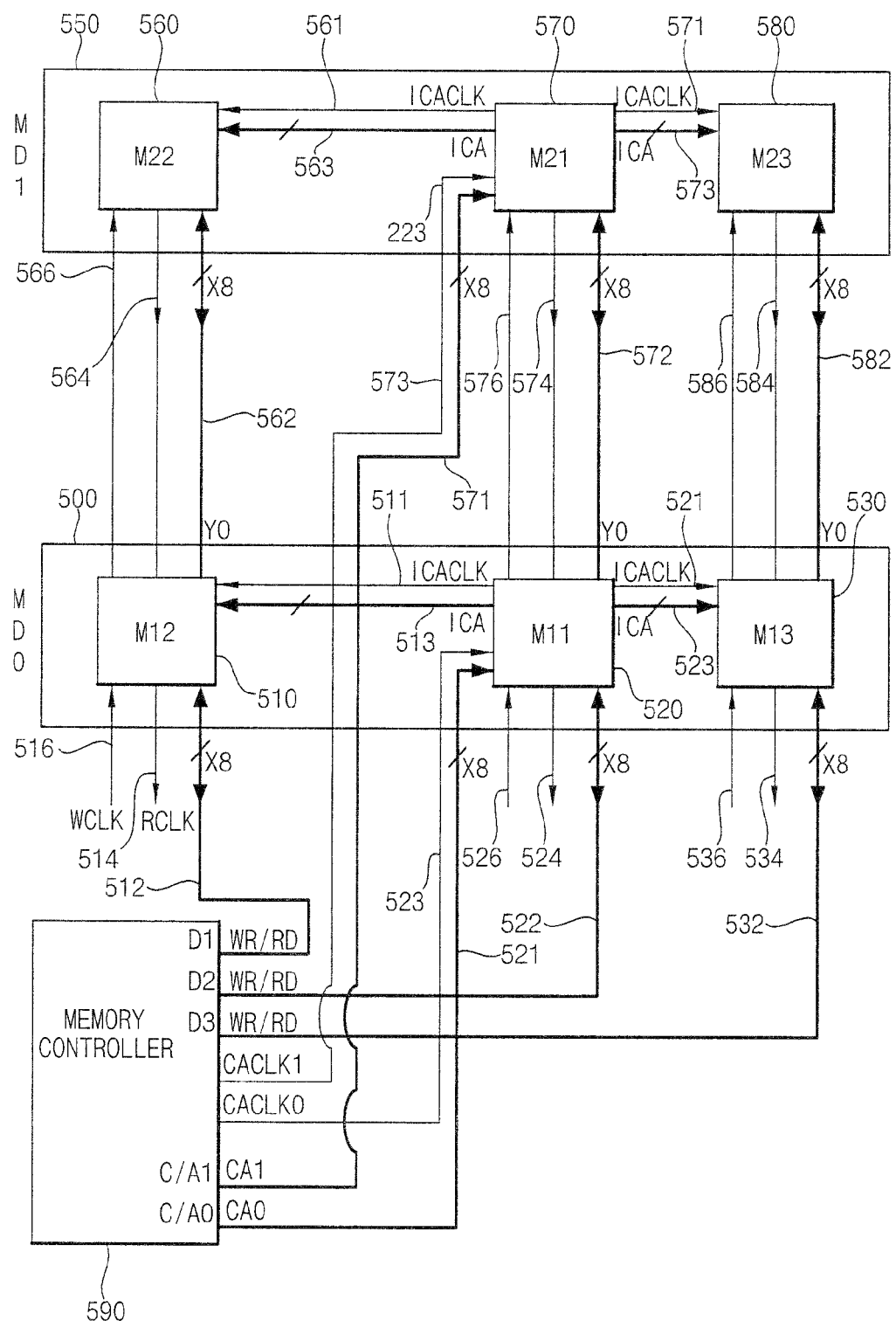
FIG. 5 is a block diagram illustrating a memory system according to another embodiment.
Figure 6A:
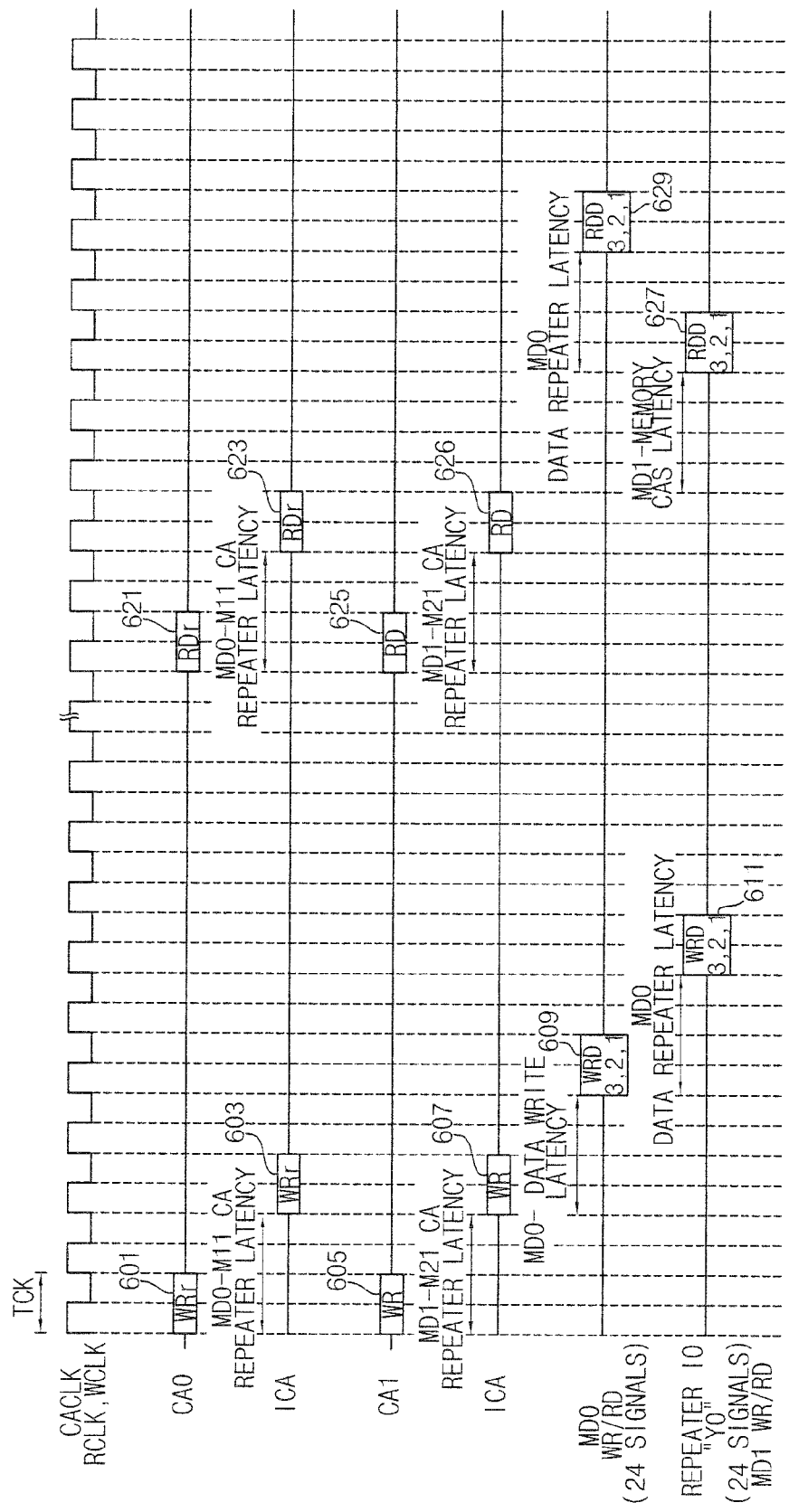
FIG. 6A is a timing diagram illustrating a write operation of a second memory module MD1 of FIG. 5.
Figure 6B:
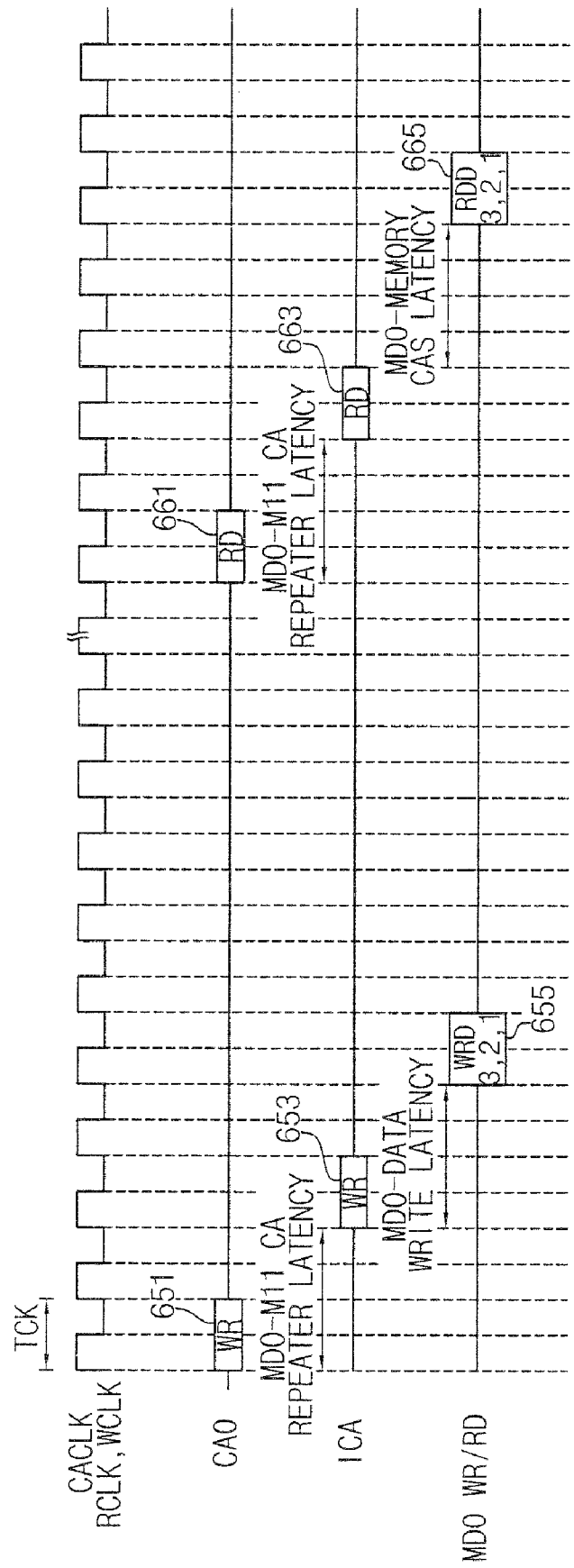
FIG. 6B is a timing diagram illustrating write and read operations of a first memory module MD0 of FIG. 5.
Figure 7:
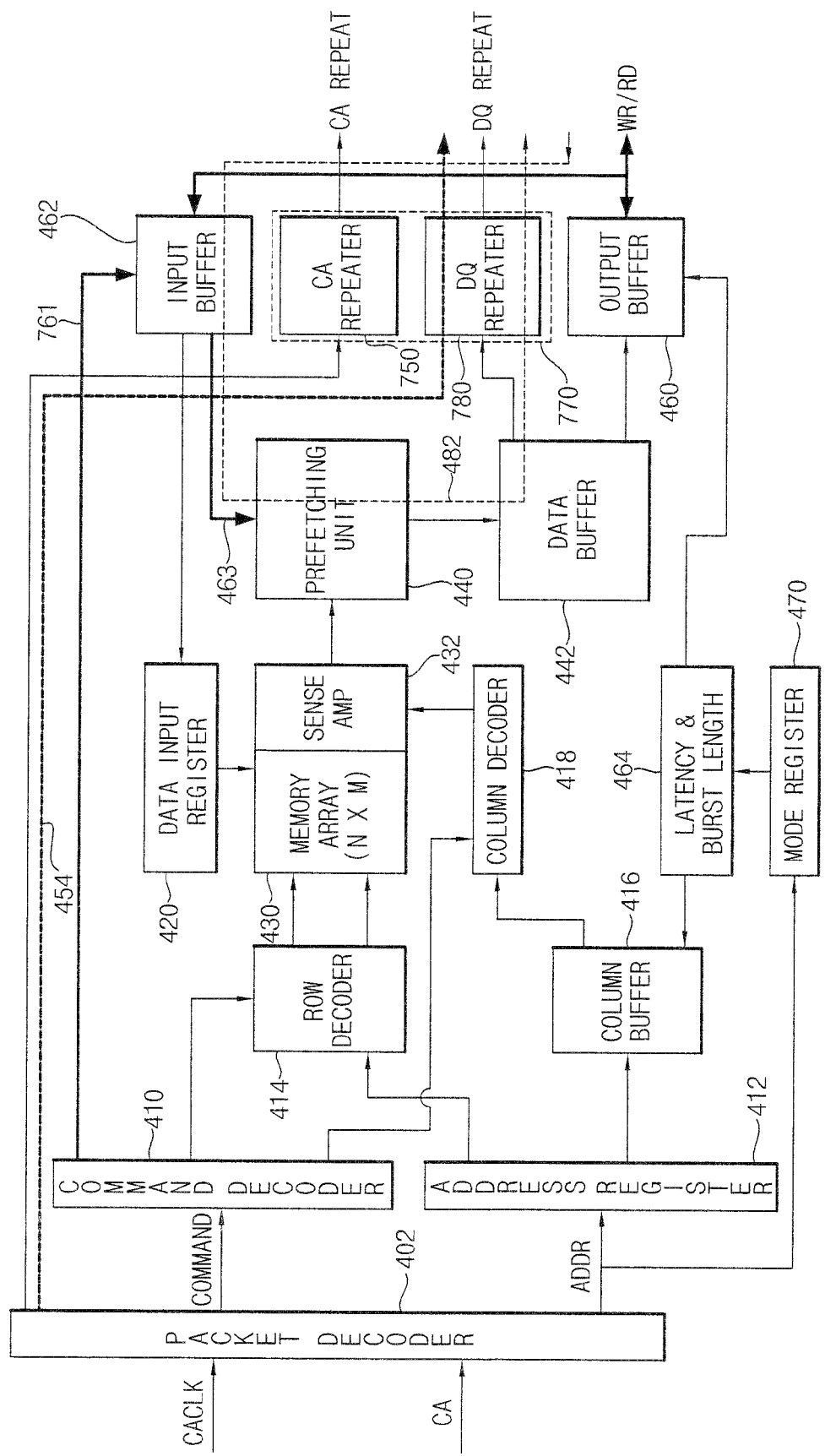
FIG. 7 is a block diagram illustrating a memory device in the memory module of FIG. 5.

FIG. 5 is a block diagram illustrating a memory system according to another embodiment, FIG. 6A is a timing diagram illustrating a write operation of a second memory module MD1 of FIG. 5, FIG. 6B is a timing diagram illustrating write and read operations of a first memory module MD0 of FIG. 5, and FIG. 7 is a block diagram illustrating a memory device in the memory module of FIG. 5.

FIG. 5 shows a memory system having two memory modules 500 (MD0) and 550 (MD1).

The two memory modules 500 and 550 are coupled to each other via a daisy chain connection. In the daisy chain connection, the clock signals and data input to/output from the memory controller 590 may be sequentially transferred to the next memory module depending on the orientation.

Referring to FIG. 5, the memory system includes memory modules 500 and 550 and a memory controller 590. For example, data ports and command/address ports of the memory controller 590 and the memory devices respectively have 8 pins.

The data port D1 of the memory controller 590 is directly coupled to the memory device 510 (M12) through a data bus 512 (WR/RD), the data port D2 of the memory controller 590 is directly coupled to the memory device 520 (M11) through a data bus 522 (WR/RD), the data port D3 of the memory controller 590 is directly coupled to the memory device 530 (M13) through a data bus 532 (WR/RD).

In a write operation, the memory device 520 (M11) of the memory module MD0 transfers the data received from the memory controller 590 to the corresponding memory device 570 (M21) in the memory module MD1 via the data bus 572. The memory device 510 (M12) of the memory module MD0 transfers the data received from the memory controller 590 to the corresponding memory device 560 (M22) in the memory module MD1 via the data bus 562. The memory device 530 (M13) of the memory module MD0 transfers the data received from the memory controller 590 to the corresponding memory device 580 (M23) in the memory module MD1 via the data bus 582.

In a read operation, the memory device 520 (M11) of the memory module 500 (MD0) reads data from the memory device 570 (M21) of the memory module 550 (MD1) via the data bus 572, and the memory controller 590 reads the data from the memory device 520 (M11) via the data bus 522. The memory device 510 (M12) of the memory module 500 (MD0) reads data from the memory device 560 (M22) of the memory module 550 (MD1) via the data bus 562, and the memory controller 590 reads the data from the memory device 510 (M12) via the data bus 512. The memory device 530 (M13) of the memory module 500 (MD0) reads data from the memory device 580 (M23) of the memory module 550 (MD1) via the data bus 582, and the memory controller 590 reads the data from the memory device 530 (M13) via the data bus 532.

Although not shown in FIG. 5, write clock buses 516, 526 and 536 (WCLK) and read clock buses 514, 524, 534 (RCLK) of the memory controller 590 are coupled to the memory devices 510, 520 and 530 (M12, M11 and M13), respectively, via a point-to-point connection.

The memory devices 520, 510 and 530 of the memory module MD0 transfers the write clock WCLK received from the memory controller 590 to the memory devices 570, 560 and 580 in the memory module MD1 via the write clock bus 576, 566 and 586.

The write data or the read data are transferred through the data bus WR/RD, and thus, data transfer of the data bus WR/RD is bidirectional.

A first command/address signal CA0 output from the command/address port C/A0 is directly coupled to the memory device M11 in the memory module MD0 via the command/address bus 521, and a second command/address signal CA1 output from the command/address port C/A1 is directly coupled to the memory device 570 (M21) in the memory module MD1 via the command/address bus 571.

The repeater 750 (refer to FIG. 7) of the memory device M11 transfers the first command/address signal CA0 to other memory devices M12 and/or M13 via the internal command/address buses 513 and 523.

The repeater 750 of the memory device M21 transfers the second command/address signal CA1 to other memory devices M22 and/or M23 via the internal command/address buses 563 and 573, The command/address signal may be packet data that includes an address information and an operand that represents a kind of command, such as a read command, a write command, a write request command and a read request command, etc. The command/address signal may be transferred as packet data through the command/address bus 227. The command/address signal may be unidirectionally transferred through the command/address buses 521 and 571.

A first command/address clock signal CACLK0 is provided to the memory device M1 from the memory controller 590 via the first command/address clock bus 523, is repeated by the repeater 750 in the memory device 520, and is transferred to other memory devices 510 and 530 inside the memory module 500 (MD0) through internal command/address clock buses 511 and 521 (ICACLK), respectively. The second command/address clock signal CACLK1 is provided to the memory device M21 from the memory controller 590 via the second command/address clock bus 573, is repeated by the repeater 750 in the memory device 570, and is transferred to other memory devices 560 and 580 inside the memory module 550 (MD1) through internal command/address clock buses 561 and 571 (ICACLK), respectively.

For example, the memory devices 510, 520, 530, 560, 570 and 580 of FIG. 5, respectively, may be implemented to have the configuration of the memory device of FIG. 7. Alternatively, a CA repeater 750 may be included only in the memory device that repeats the command/address signal. Alternatively, a DQ repeater 780 may be included only in the memory device that repeats the data.

The CA repeater 750 is activated when the corresponding memory device repeats the command/address signal, and the DQ repeater 780 is activated when the corresponding memory device repeats the data to other memory devices.

The CA repeater 750 or the DQ repeater 780 is activated when the memory devices M11, M12, M13, M21, M22 and M23 of the memory module MD0 and MD1 repeat the command/address signal or the data respectively.

Hereinafter, referring to FIGS. 5, 6A, 6B and 7, the write and read operations of the memory modules (MD1) 550 and 500 are explained.

In the embodiment shown in FIG. 5, the memory device M11 of the memory module MD0 performs repeating functions of the command/address signal and the data, the memory device M21 of the memory module MD1 performs a repeating function of only the command/address signal, and the memory devices M12 and M13 of the memory module MD1 perform a repeating function of only the data. The memory devices M22 and M23 of the memory module MD1 do not perform any of the repeating function of the command/address signal or the repeating function of the data.

Referring to FIGS. 5, 6A and 7, the write and read operations of the memory module 550 are explained.

Referring to FIG. 6A, the memory controller 590 provides the memory device M11 with a command/address signal 601 (WRr) having a write request command, which requests data to be written into the memory module MD1, and a command/address signal 621 (RDr) having a read request command, which requests data to be read from the memory module MD1, through the first command/address bus 521 in response to the command/address clock signal CACLK. The memory device of the memory module MD0 repeats the data received from the memory controller 590 to the memory module MD1 in response to the write request command. The memory device of the memory module MD0 requests to the memory module MD1 that the memory module MD1 repeat the data to the memory controller 590 in response to the read request command.

The command/address signals 601 and 621 are repeated by the repeater 750 of the memory device M11, and are output as internal command/address signals 603 and 623 after a predetermined time period (i.e., a latency due to the CA repeater 750 of the memory device M11 in the memory module MD0). The internal command/address signals 603 and 623 are retransmitted to the memory devices M12 and M13 through the internal command/address buses (ICA) 513 and 523.

In addition, the memory controller 590 provides the command/address signal 605 having the write command, and the command/address signal 625 having the read command to the memory device M21 through the second command/address bus 571.

The write command/address signals 605 or the read command/address signal 625 is repeated by the repeater of the memory device M21, and are output as internal command/address signals 607 and 626 after a time period (i.e., a latency due to the CA repeater 750 of the memory device M21 in the memory module MD1). The internal command/address signals 607 and 626 are retransmitted to the memory devices M22 and M23 through the internal command/address buses (ICA) 563 and 573.

The write command/address signal 605 may be packet data having the write command and the address information, and the read command/address signal 625 may be packet data having the read command and the address information.

The write request command, which requests that data be written into the memory module MD1, of the command/address signals 601 and 603 may be used as a DQ repeater control signal (not shown) for activating the DQ repeater 780 of the memory device M11.

When the DQ repeater 780 of the memory devices M11 and M12 and/or M13 is activated in response to the DQ repeater control signal, the write data WRD1, WRD2 and WRD3 that are respectively input to the memory devices M11, M12 and M13 in the memory module MD0 are output to the memory devices M21, M22 and M23 in the memory module MD1 via a Y0 pin of the memory devices M11, M12 and M13.

Although the repeater 770 of FIG. 7 is implemented by two repeaters, i.e., the CA repeater 750 and the DQ repeater 780, the repeater 770 may also be implemented by one repeater.

In a write operation, the memory controller 590 provides the write data 611 (WRD1, WRD2 and WRD3) to the memory devices M11, M12 and M13 via the data buses 522, 512 and 532 in response to the write clock WCLK. The write data 611 (WRD1, WRD2 and WRD3) may be simultaneously output to the data buses, and alternatively may be sequentially output to the data buses.

The write data may be provided to the memory module MD0 after a time period (i.e., a write latency through the memory device M11 and/or M12 or a write latency through the memory device M11 and/or M13), after the repeater of the memory device M21 outputs the command/address signal 607 via the ICA.

A control signal 761 is generated based on the command/address signal 601 having the write request command WRr, which requests data to be written into the memory module MD1, to be output to the input buffer 462.

When the write request command WRr, which requests data to be written into the memory module MD1, is applied to the memory devices M11, M12 and M13, the write data 609 (WRD1, WRD2 and WRD3), which are received through the data buses 512, 522 and 532 of the memory module MD0, are not written into the memory array 430 of the memory devices M11, M12 and M13. Instead, but the write data 609 (WRD1, WRD2 and WRD3) are repeated by the DQ repeater 780 of the memory devices M11, M12 and M13 and output to the Y0 pin of the DQ repeater 780 of the memory devices M11, M12 and M13 as write data 611 (WRD1, WRD2 and WRD3) through the data bypass path 482. The write data 609 (WRD1, WRD2 and WRD3) are provided to the memory devices M21, M22 and M23 through the data buses 572, 562 and 582.

The write data 611 (WRD1, WRD2, and WRD3), which are output to the Y0 pin of the DQ repeater 780 of the memory devices M11, M12 and M13 are stored in a corresponding memory device among the memory devices M21, M22 and M23 in response to the internal command/address signal 607 that is received by or transferred from the memory device M21.

In a read operation, the memory devices of the memory module MD1 receive the read command 626, and output the read data 627 (RDD1, RDD2 and RDD3) to the corresponding memory devices of the memory module MD0 through the data buses 572, 562 and 582, respectively, after a CAS latency. The read data 627 (RDD1, RDD2 and RDD3) may be simultaneously output, or alternatively, sequentially output.

Each of the repeaters of the memory devices M11, M12 and M13 in the memory module MD0 is activated in response to the read request command RDr. The read data RDD1, RDD2 and RDD3, which are output on the data buses 572, 562 and 582 by the memory module MD1, are respectively repeated by the DQ repeaters 780 of the memory devices M11, M12 and M13, are passed through the data bypass path 482, and are output to the data buses 522, 512 and 532.

Hereinafter, referring to FIGS. 5, 6B and 7, the write and read operations of the memory module (MD0) 500 are explained.

Referring to FIG. 6B, the memory controller 590 provides a command/address 651 having a write command and address information and a command/address 661 having a read command and address information to the memory device M11 through the command/address bus 521 in response to the command/address clock signal CACLK.

The command/address signals 651 and 661, which are input to the memory device M11, are delayed by a time period (i.e., an M11 CA repeater latency due to the bypass path 454 of FIG. 7), and are repeated by the CA repeater 750 and transferred as the command/address signals 653 and 663 to the memory device M12 or M13 through the internal command/address bus ICA of the memory device M11.

In a write operation, the memory controller 590 provides the write data 655 (WRD1, WRD2 and WRD3) to each of the memory devices M11, M12 and M13 via the data buses 522, 512 and 532 in response to the write clock WCLK after the write latency. The write data 655 (WRD1, WRD2 and WRD3) may be simultaneously output to the data buses, and alternatively, sequentially output to the data buses.

The write data 655 (WRD1, WRD2 and WRD3), which are input to the memory devices M11, M12 and M13 via the input buffer 462 thereof, are written to the respective memory arrays 430 of the memory devices M11, M12 and M13 through the data input register 420.

In a read operation, after the command/address signal 663 having the read command is output, the read data 665 (RDD3, RDD2 and RDD1) are read to be output to the memory controller 590 through the data buses 532, 512 and 522, respectively, after a time period (i.e., a CAS latency through the memory devices M11 and/or M12 or a CAS latency through the memory devices M11 and/or M13). The read data 665 (RDD3, RDD2 and RDD1) may be simultaneously output, or alternatively, sequentially output.

FIG. 7 shows an example of internal blocks of a DRAM device having n×m memory cells. Although the above embodiment shows a configuration of the internal blocks of a DRAM device, any configuration of a memory device having a data bypass path and a command/address bypass path, or any other configuration known to one of ordinary skill in the art may also be utilized in place of the configuration of the internal blocks of the DRAM device of FIG. 7.

Data reads and writes do not always access a memory device at a ratio of 1 to 1. For example, the access frequency of the data write may be smaller than that of the data reads. Thus, the capacitive load of the DRAM and the number of the total pins of the memory system may be reduced when either the read bus or the write bus operates independently. When the read bus and the write bus are separated, the write data line may be used only as an input, and thus the write data line may be used together with the command/address bus and may be a unidirectional data bus.

Figure 8A:
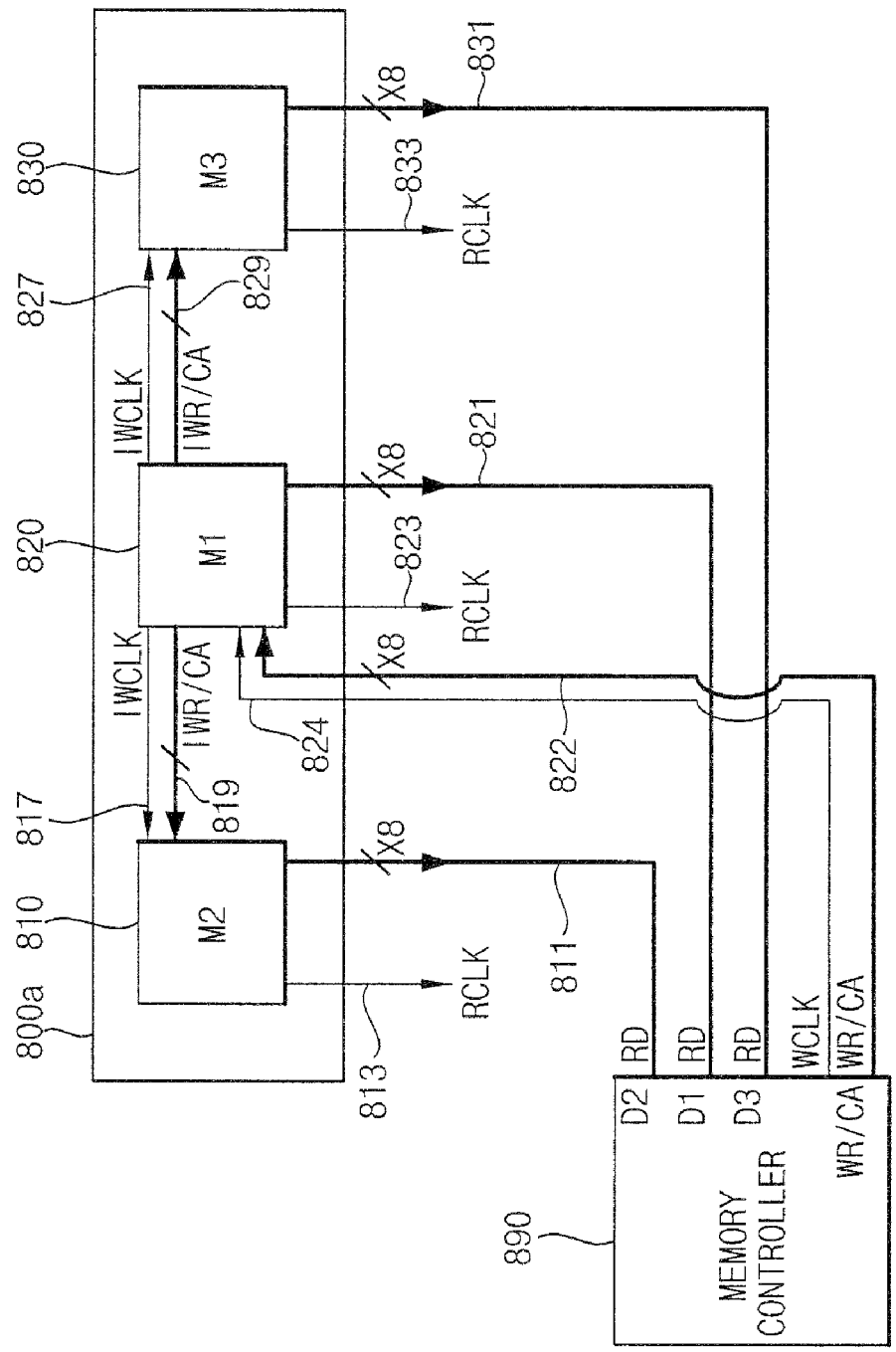
FIGS. 8A through 8D are block diagrams illustrating memory systems in which write data and a command/address signal are transmitted through a common bus according to other embodiments.
Figure 8B:
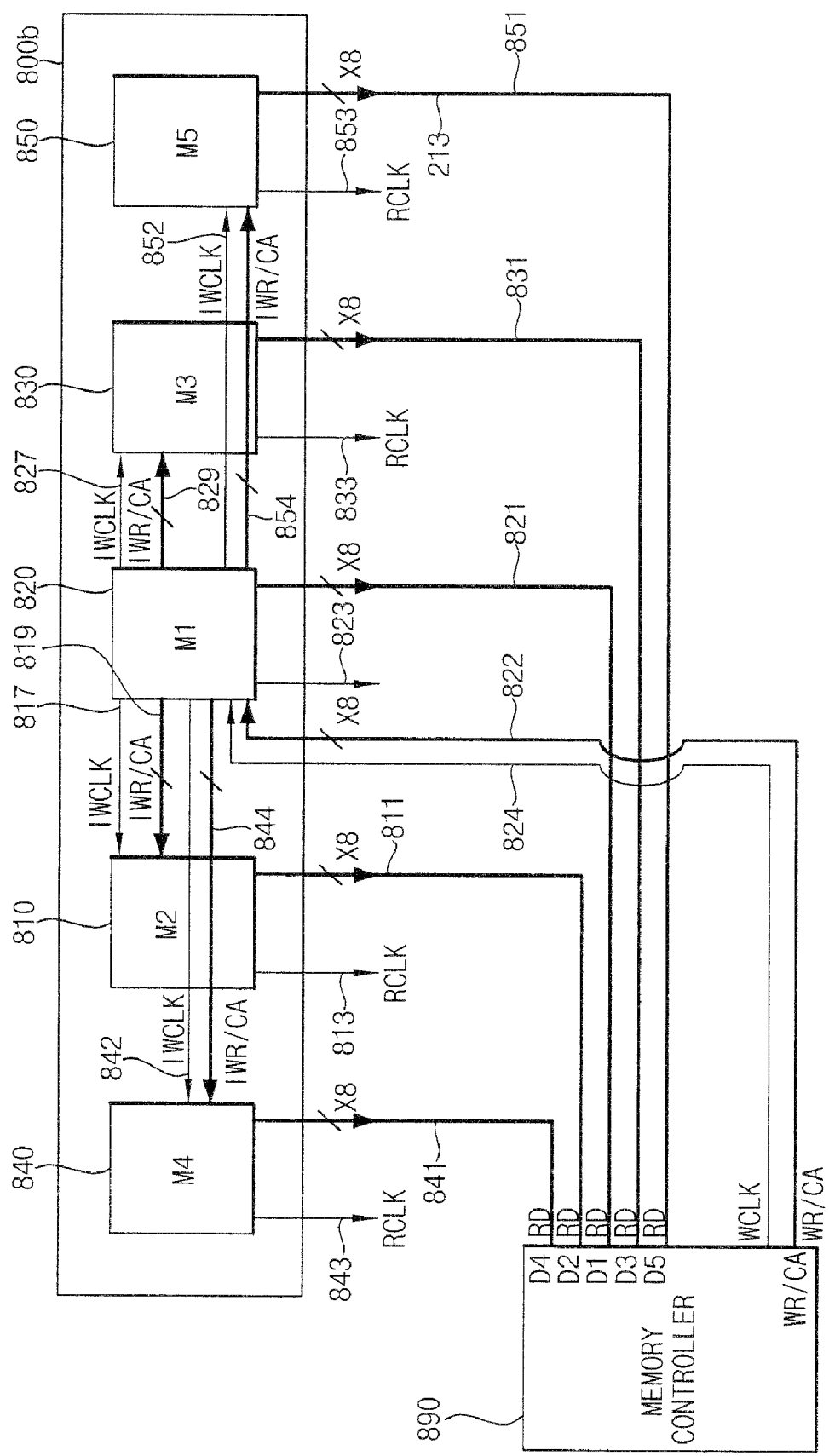
Figure 9:
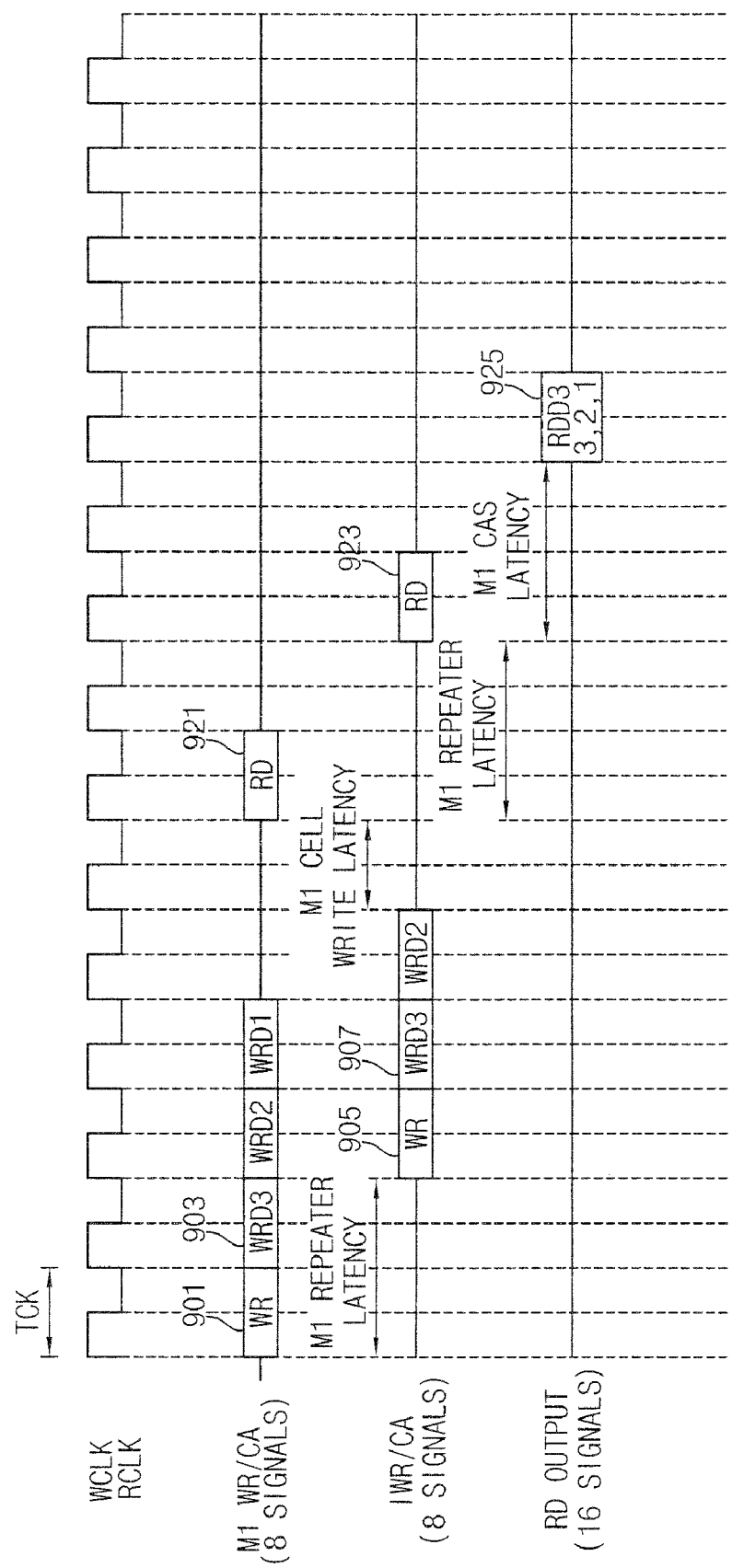
FIG. 9 is a timing diagram illustrating a read operation and a write operation of a memory module of FIG. 8A.
Figure 10:
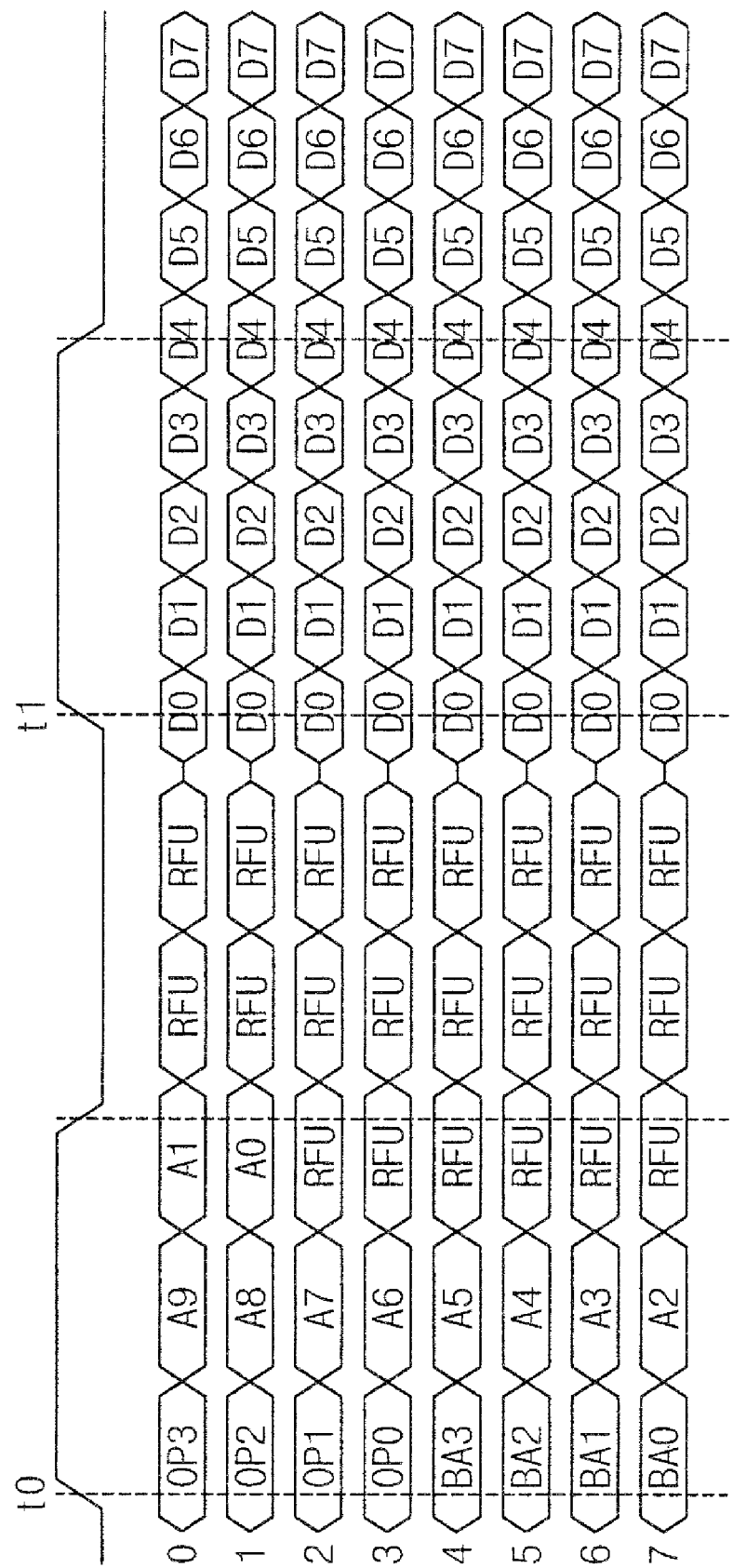
FIG. 10 is a schematic diagram illustrating a structure of a packet used in the memory systems in which write data and a command/address signal are transmitted through a common bus.
Figure 11:
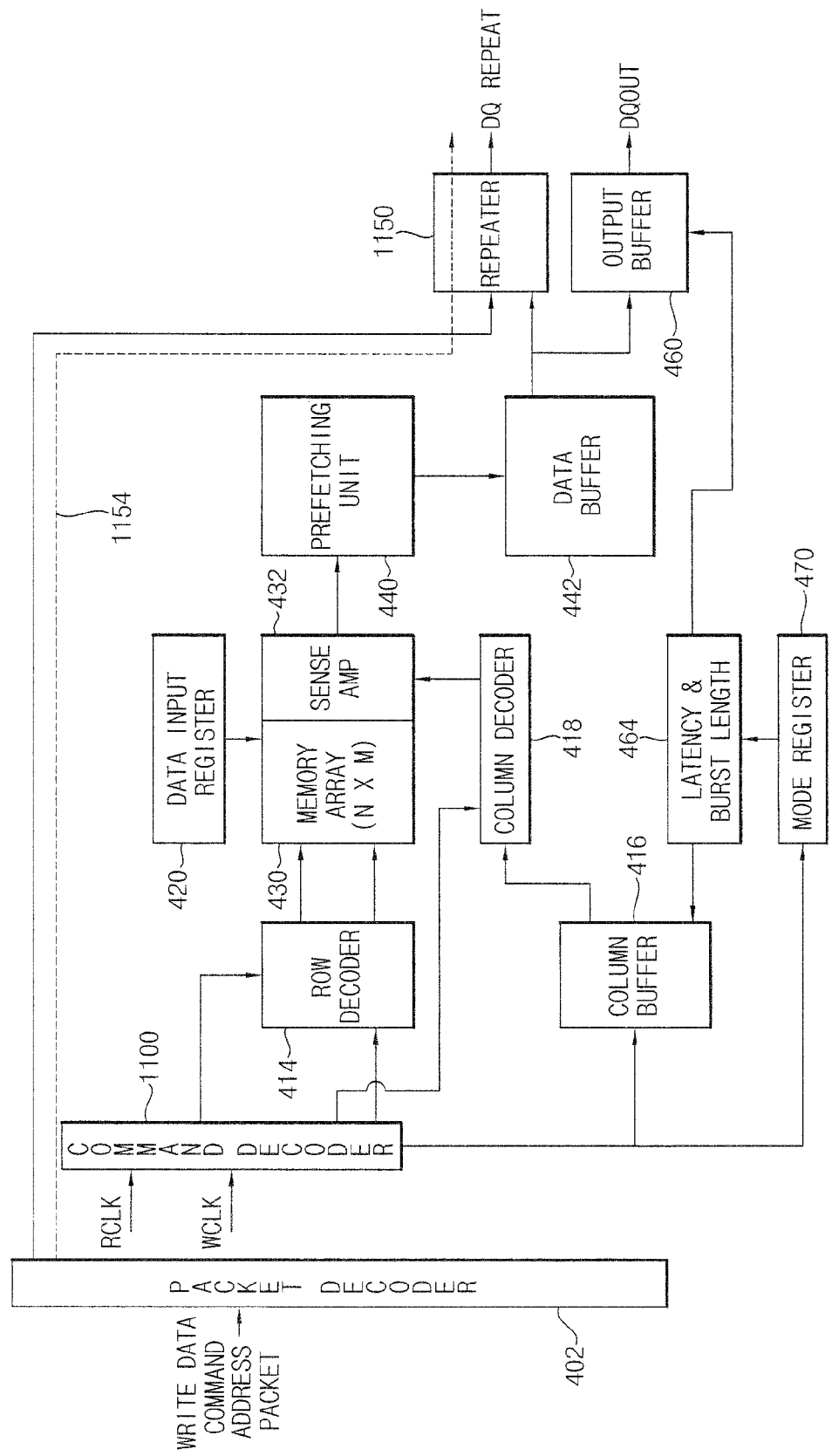
FIG. 11 is a block diagram illustrating a memory device in the memory modules of FIGS. 8A through 8D.

FIGS. 8A through 8D are block diagrams illustrating memory systems in which write data and a command/address signal are transmitted through a common bus according to other embodiments. FIG. 9 is a timing diagram illustrating a read operation and a write operation of a memory module of FIG. 8A. FIG. 10 is a schematic diagram illustrating a structure of a packet where write data and a command/address signal of FIGS. 8A and 8B are merged. FIG. 11 is a block diagram illustrating a memory device in the memory modules of FIGS. 8A through 8D. For example, data ports and command/address ports of a memory device respectively have 8 pins.

Referring to FIG. 8A, the memory system includes a memory module 800a and a memory controller 890. The memory system of FIG. 8A differs from the memory system of FIG. 2A in that a read data bus and a write data bus are separated, and the write data bus is merged with the command/address bus.

The data ports D1, D2 and D3 of the memory controller 890 are directly coupled to the memory devices 820, 810 and 830 (M1, M2 and M3) through data buses 821, 811 and 831 (RD), respectively.

Although not shown in FIG. 8A, read clock buses 823, 813 and 833 (RCLK) of the memory controller 890 are coupled to the memory devices 820, 810 and 830, respectively, via a point-to-point connection. The read data are transferred through the read data bus RD, and the data transfer of the read data bus RD is unidirectional.

The write data and the command/address signal output from the WR/CA port of the memory controller 890 are directly coupled to the memory device 820 via the WR/CA bus 822. The write data and the command/address signal are repeated by a repeater 1150 (refer to FIG. 11) in the memory device 820, and are transferred to other memory devices 810 and 830 inside the memory module 800a through internal WR/CA bus 819 and 829 (IWR/CA), respectively. Namely, the write data and the command/address signal input to the memory device 820 are repeated and transferred to other memory devices of the memory module 800a.

For example, the command/address signal includes address information, a read command, and/or a write command, etc.

The write clock signal WCLK is provided from the memory controller 890 to the memory device 820 through the write clock bus 824 (WCLK), is repeated by the repeater 1150 in the memory device 820, and is transferred to other memory devices 810 and 830 inside the memory module 800a through internal write clock buses 817 and 827 (IWCLK), respectively.

Referring to FIG. 10, the write data and the command/address signal may be transferred through 8 pins, and may be packet data that includes write data D0 through D7, the address information and operands OP3, OP2, OP1 and OP0 that each represent a kind of command, such as a read command and a write command, etc. The address information may include bank addresses BA3, BA2, BA1 and BA0, and addresses A9 through A0. Reserved For Use (RFU) bits represent bits that are reserved for future use. The write data and the command/address signal are unidirectionally transferred as a packet format through the write data/command/address bus (WR/CA) 822.

A burst length of the write data may be eight, or the burst length may be different from eight.

Hereinafter, referring to FIGS. 9 and 10, the write and read operations of a memory module (for example, the memory module 800a of FIG. 8A) are explained.

Referring to FIG. 9, the write data 903 (WRD3, WRD2 and WRD1) and the command/address signals 901 are input to the memory device 820 through the WR/CA bus 822 in response to the write clock signal WCLK. The command/address signal 901 includes data write command WR and address information.

In a write operation, the write data 903 (WRD3, WRD2 and WRD1) and the command/address signals 901 are input to a packet decoder 402 in the memory device 820, and are bypassed to an adjacent memory device. After a delay, i.e., an M1 repeater delay, due to a bypass path 1154, the write data 903 (WRD3, WRD2 and WRD1) and the command/address signals 901 passed through the bypass path 1154 are input into the repeater 1150, and are repeated by the repeater 1150 in the memory device 820. The write data 903 (WRD3, WRD2 and WRD1) and the command/address signals 901 passed through the bypass path 1154 may still have a packet format. The write data 903 (WRD3, WRD2 and WRD1) and the command/address signals 901 are transferred to the memory devices 810 and 830 through the IWR/CA buses 819 and 829.

For example, the memory controller 890 provides the write data WRD to the WR/CA bus in an order such that the last write data WRD is to be written to the memory device 820 that receives the write data WRD from the memory controller 890. The earlier write data WRD is to be written to memory devices 810 and 830 that receive the write data WRD retransmitted from the memory device 820. The write data WRD that was to be written to the memory device 820 is not retransmitted to the other memory devices 810 and 830.

In a read operation, the read data 925 (RDD3, RDD2 and RDD1) are output to the memory controller 890 through the data buses 831, 821 and 811 after the command/address signal 921 including a read command is output after a time period (i.e., a CAS latency through the memory devices 820 and/or 810, or a CAS latency through the memory devices 820 and/or 830). The read data 925 (RDD3, RDD2 and RDD1) may be simultaneously output, or alternatively, sequentially output.

FIG. 8B is a block diagram illustrating a memory system in which write data and a command/address signal are transmitted through a common bus according to another embodiment.

Referring to FIG. 8B, the memory system includes a memory module 800b and a memory controller 890. The memory module 800b has memory devices M1 through M5.

The data ports D1, D2, D3, D4 and D5 of the memory controller 890 are coupled to the memory devices 820, 810, 830, 840 and 850 (M1, M2, M3, M4 and M5), respectively, through data buses 821, 811, 831, 841 and 851 via a point-to-point connection. Although not shown in FIG. 8B, read clock buses RCLK 823, 813, 833, 843 and 853 (RCLK) of the memory controller 890 are coupled to the memory devices M1, M2, M3, M4 and M5, respectively, via a point-to-point connection.

The write data and the command/address signal are repeated by the repeater 1150 in the memory device 820, and are transferred to other memory devices M2, M3, M4 and M5.

Particularly, the write data and the command/address signal output from the WR/CA pin of the memory controller 890 are directly coupled to the memory device 820 through the WR/CA bus 822, are repeated by the repeater 1150 in the memory device 820, and are transferred to the memory devices 810, 830, 840 and 850 in the memory module 800b through the IWR/CA buses 819, 829, 844 and 854. The write data and the command/address signal may be unidirectionally transferred through the IWR/CA bus as a packet format.

Alternatively, the write data and the command/address signal may be input to one of the memory devices 810, 830, 840 and 850, may be repeated by a repeater of one of the memory devices 810, 830, 840 and 850, and transferred to one or more of the other memory devices. Furthermore, the write data and the command/address signal may be provided to a subset of the memory devices 810, 820, 830, 840 and 850. Any memory device that did not receive the write data and the command/address signal may receive it from one of the memory devices that did receive it.

The write clock signal WCLK is provided to the memory device 820 via the write clock bus 824 from the memory controller 890, is repeated by the repeater 1150 in the memory device 820, and is transferred to other memory devices 810, 830, 840 and/or 850 inside the memory module 800c through write clock buses 817, 827, 842 and 852 (IWCLK), respectively.

In FIG. 8B, the memory device 820 transfers the write data and the command/address signal to the memory devices 810 and 840 through two different IWR/CA buses 819 and 844, and transfers the write data and the command/address signal to the memory devices 830 and 850 through two different IWR/CA buses 829 and 854. In addition, the memory device 820 transfers the write clock signal WCLK to the memory devices 810 and 840 through two different IWCLK buses 817 and 842, and the memory device 820 transfers the write clock signal WCLK to the memory devices 830 and 850 through two different IWCLK buses 827 and 852.

Figure 8C:
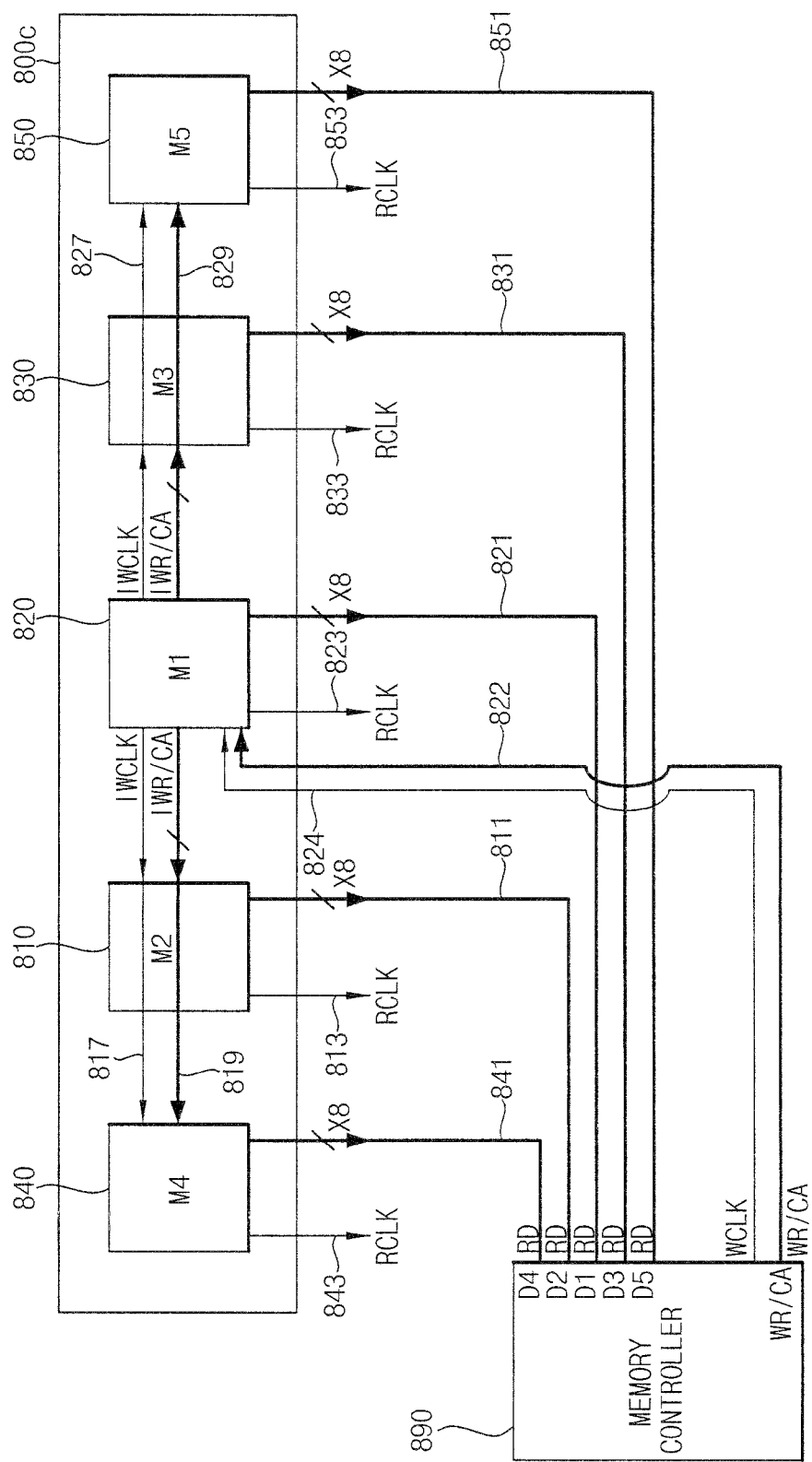

FIG. 8C is a block diagram illustrating a memory system in which write data and a command/address signal are transmitted through a common bus according to another embodiment.

In FIG. 8C, the memory device 820 transfers the write data and the command/address signal to the memory devices 810 and 840 through a common IWR/CA bus 819, and transfers the write data and the command/address signal to the memory devices 830 and 850 through a common IWR/CA bus 829. Thus, the number of the pins of the memory module may be reduced. In addition, the memory device 820 transfers the write clock signal WCLK to the memory devices 810 and 840 through a common IWCLK bus 817, and the memory device 820 transfers the write clock signal WCLK to the memory devices 830 and 850 through a common IWCLK bus 827. Thus, the number of the pins of the memory module may be reduced.

Namely, the memory device 820 transfers the write data, the command/address signal, and/or the write clock signal to the other memory devices through a common pin, and thus the number of the pins of the memory module may be reduced.

Figure 8D:
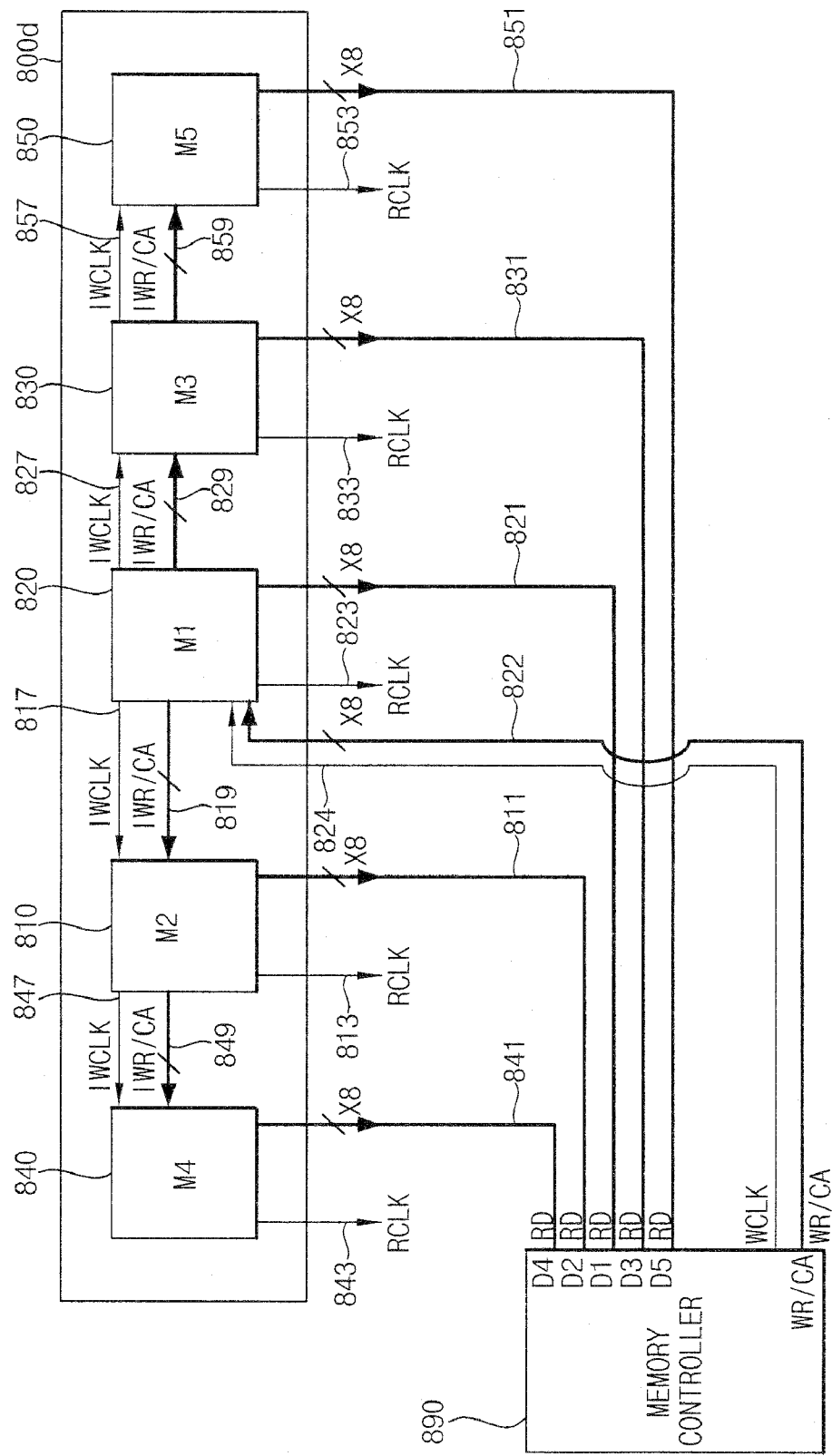

FIG. 8D is a block diagram illustrating a memory system in which write data and a command/address signal are transmitted through a common bus according to still another example embodiment of the present invention.

Referring to FIG. 8D, data ports D1, D2, D3, D4 and D5 of the memory controller 890 are coupled to the memory devices 820, 810, 830, 840 and 850 (M1, M2, M3, M4 and M5), respectively, through data buses 821, 811, 831, 841 and 851 via a point-to-point connection. Although not shown in FIG. 8D, read clock buses RCLK 813, 823, 833, 843 and 853 (RCLK) of the memory controller 890 are coupled to the memory devices M2, M1, M3, M4 and M5, respectively, via a point-to-point connection.

In FIG. 8D, the repeater 1150 of the memory device 820 re-drives the write data and the command/address signal. The repeated write data and the command/address signal are transferred to the memory device 810 and/or 830 adjacent to the memory device 820. Then, the write data and the command/address signal are transferred to the memory device 840 and/or 850 from the memory device 810 and/or 830.

Particularly, a repeater in the memory device 810, which receives the write data and the command/address signal from the memory device 820, transfers the write data and the command/address signal to the memory device 840 adjacent to the memory device 810 in the memory module 800d. A repeater in the memory device 830, which receives the write data and the command/address signal from the memory device 820 transfers the write data and the command/address signal to the memory device 850 adjacent to the memory device 830 in the memory module 800d.

The write clock signal WCLK is provided to the memory device 820 via the write clock bus 824 from the memory controller 890, is repeated by the repeater 1150 in the memory device 820, and is transferred to the memory devices 810 and/or 830 through the write clock buses 817 and 827, respectively, and then is transferred to the memory devices 840 and/or 850 by the memory devices 810 and 830, respectively.

FIG. 11 shows an example of internal blocks of the DRAM devices of FIGS. 8A through 8D. Although the above embodiments show a configuration of the internal blocks of the DRAM device of FIG. 11, any configuration of a memory device including a repeater having a write data bypass path or a command/address bypass path, or any other configuration known to one of ordinary skill in the art may also be utilized in place of the configuration of the internal blocks of the DRAM devices of FIGS. 8A through 8D.

Figure 12A:
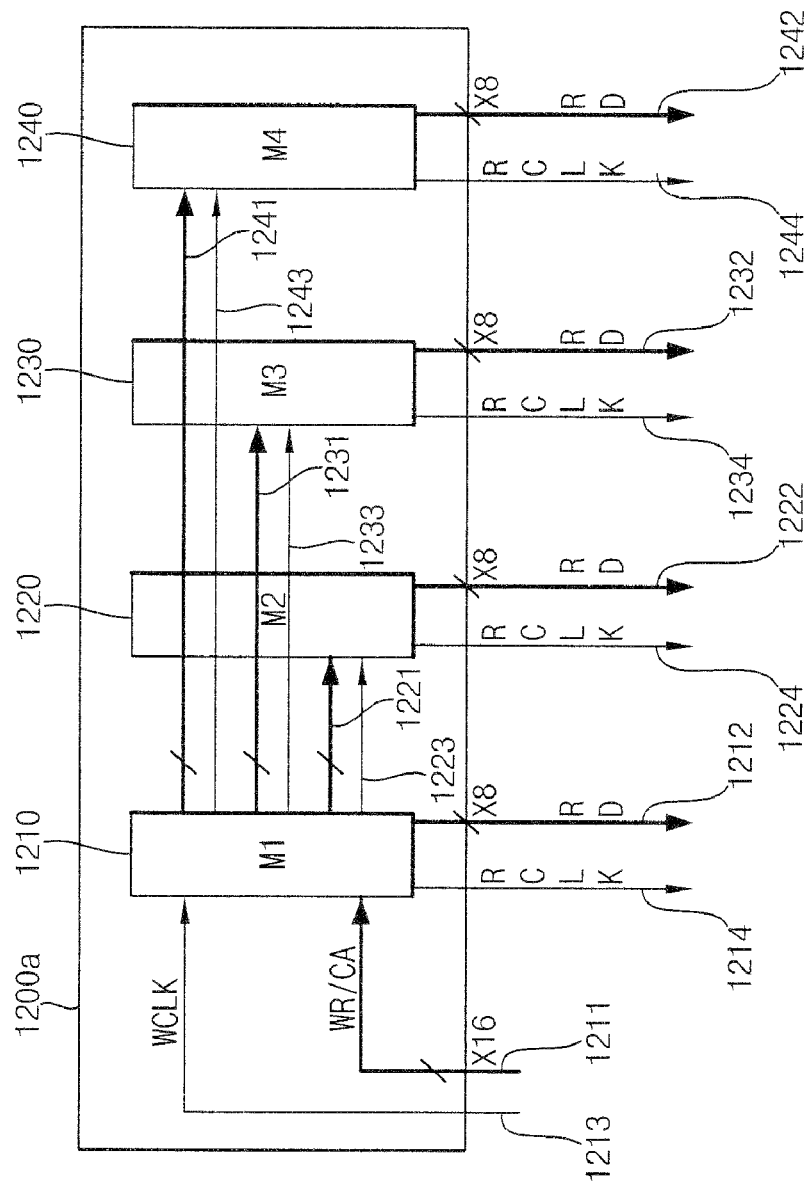
FIGS. 12A and 12B are block diagrams illustrating a memory module in which write data and a command/address signal are transmitted through a common bus according to still other embodiments.

FIG. 12A is a block diagram illustrating a memory module 1200a in which write data and a command/address signal are transmitted through a common bus according to another embodiment.

Referring to FIG. 12A, the memory system of FIG. 12A is different from the memory system of FIG. 8A in that the write data, the command/address signal and the write clock signal are input to a memory device that is not disposed in the middle of the memory module, and then the write data, the command/address signal and the write clock signal are transferred to other memory devices in the memory module.

Particularly, a memory device 1210 receives the write data and the command/address signal from a memory controller (not shown) through the WR/CA bus 1211, and transfers the write data and the command/address signal to the memory devices 1220, 1230 and 1240 in the memory module 1200a through internal WR/CA buses 1221, 1231 and 1241. The memory device 1210 receives the write clock signal from the memory controller (not shown) through the write clock bus WCLK 1213, and transfers the write clock signal to the other memory devices 1220, 1230 and 1240 in the memory module 1200b through internal write clock buses 1223, 1233 and 1243.

That is, the memory device 1210 of FIG. 12A transfers the write data and the command/address signal to the memory devices 1220, 1230 and 1240 through three different IWR/CA buses 1221, 1231 and 1241. In addition, the memory device 1210 transfers the write clock signal WCLK to the memory devices 1220, 1230 and 1240 through three different write clock buses 1223, 1233 and 1243 (WCLK).

Figure 12B:
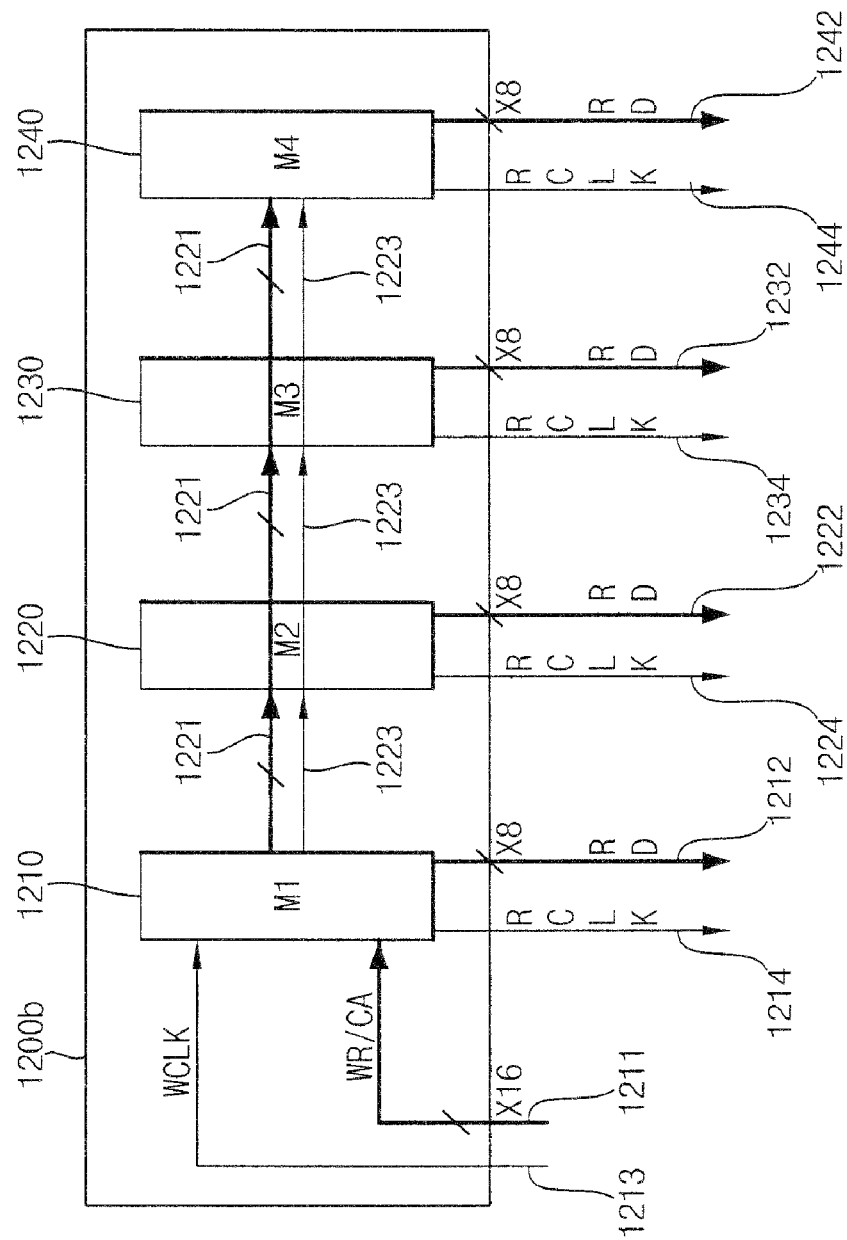

FIG. 12B is a block diagram illustrating a memory module 1200b in which write data and a command/address signal are transmitted through a common bus according to another embodiment.

Compared to FIG. 12A, the memory device 1210 in FIG. 12B transfers the write data and the command/address signal to the memory devices 1220, 1230 and 1240 through a common IWR/CA bus 1221, and thus the number of pins of the memory module may be reduced. In addition, the memory device 1210 transfers the write clock signal WCLK to the memory devices 1220, 1230 and 1240 through a common internal clock bus 1223 (IWCLK), and thus the number of the pins of the memory module may be reduced.

The memory device 1210 transfers the write data, the command/address signal and/or the write clock signal WCLK to other memory devices via a common pin, and thus the number of the pins of the memory module may be reduced.

Figure 13A:
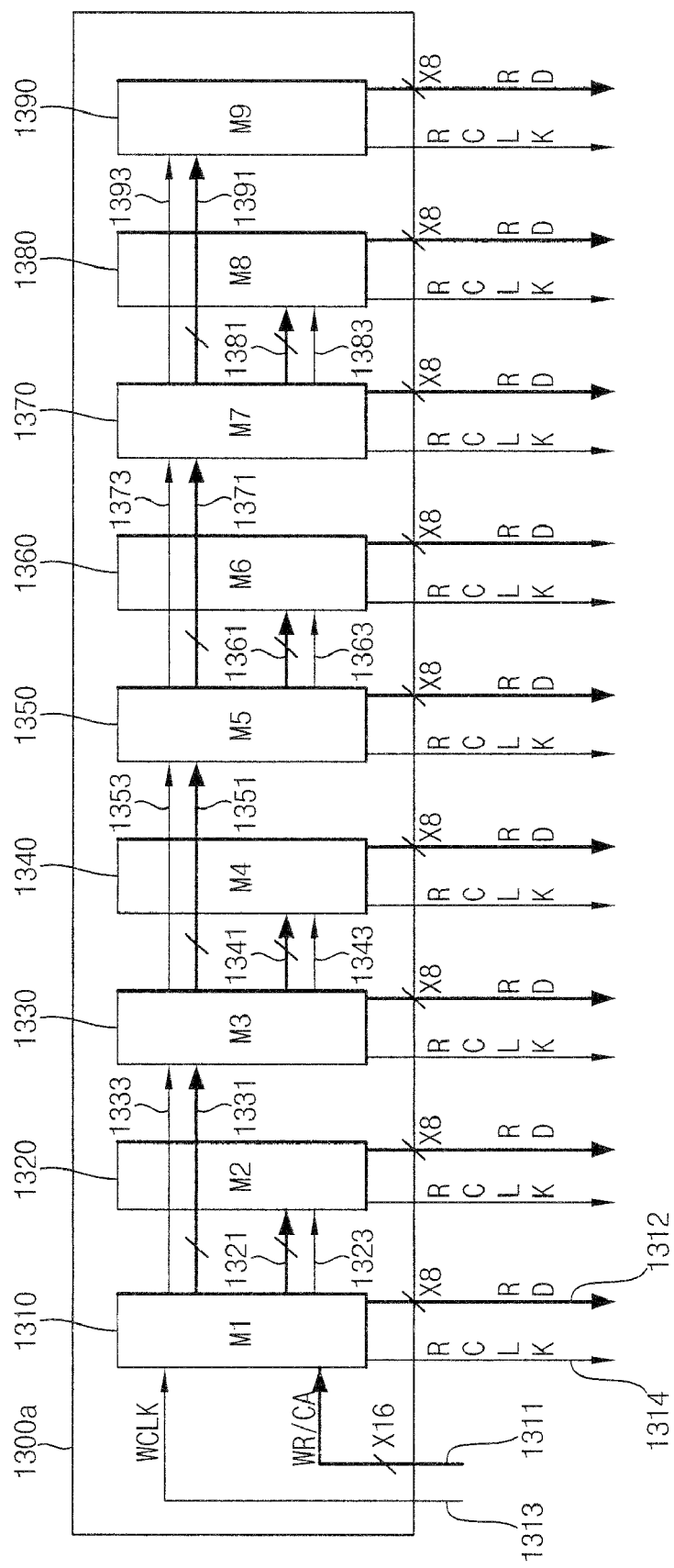
FIGS. 13A and 13B are block diagrams illustrating a memory module in which write data and a command/address signal are transmitted through a common bus according to still other embodiments.

FIG. 13A is a block diagram illustrating a memory module 1300a in which write data and a command/address signal are transmitted through a common bus according to another embodiment.

Referring to FIG. 13A, the memory system of FIG. 13A is similar to the memory system of FIG. 8A in that a memory device transfers the write data, the command/address signal and the write clock signal WCLK to two memory devices. The memory system of FIG. 13A is different from the memory system of FIG. 8A in that repeaters 1150 (refer to FIG. 11) of the first, third, fifth and seventh memory devices M1, M3, M5 and M7 are activated so that the write data, the command/address signal and the write clock signal are unidirectionally transferred.

Particularly, a memory device 1310 receives the write data and the command/address signal from a memory controller (not shown) through the WR/CA bus 1311, and transfers the write data and the command/address signal to the memory devices 1320 and 1330 in the memory module 1300a through two different IWR/CA buses 1321 and 1331, respectively. In addition, the memory device 1330, which receives the write data and the command/address signal from the memory device 1310 through the IWR/CA bus 1331 transfers the write data and the command/address signal to the memory devices 1340 and 1350 through two different IWR/CA buses 1341 and 1351, respectively. In this way, the write data and the command/address signal are eventually transferred from the memory devices 1370, through other memory devices to two different memory devices 1380 and 1390.

Figure 13B:
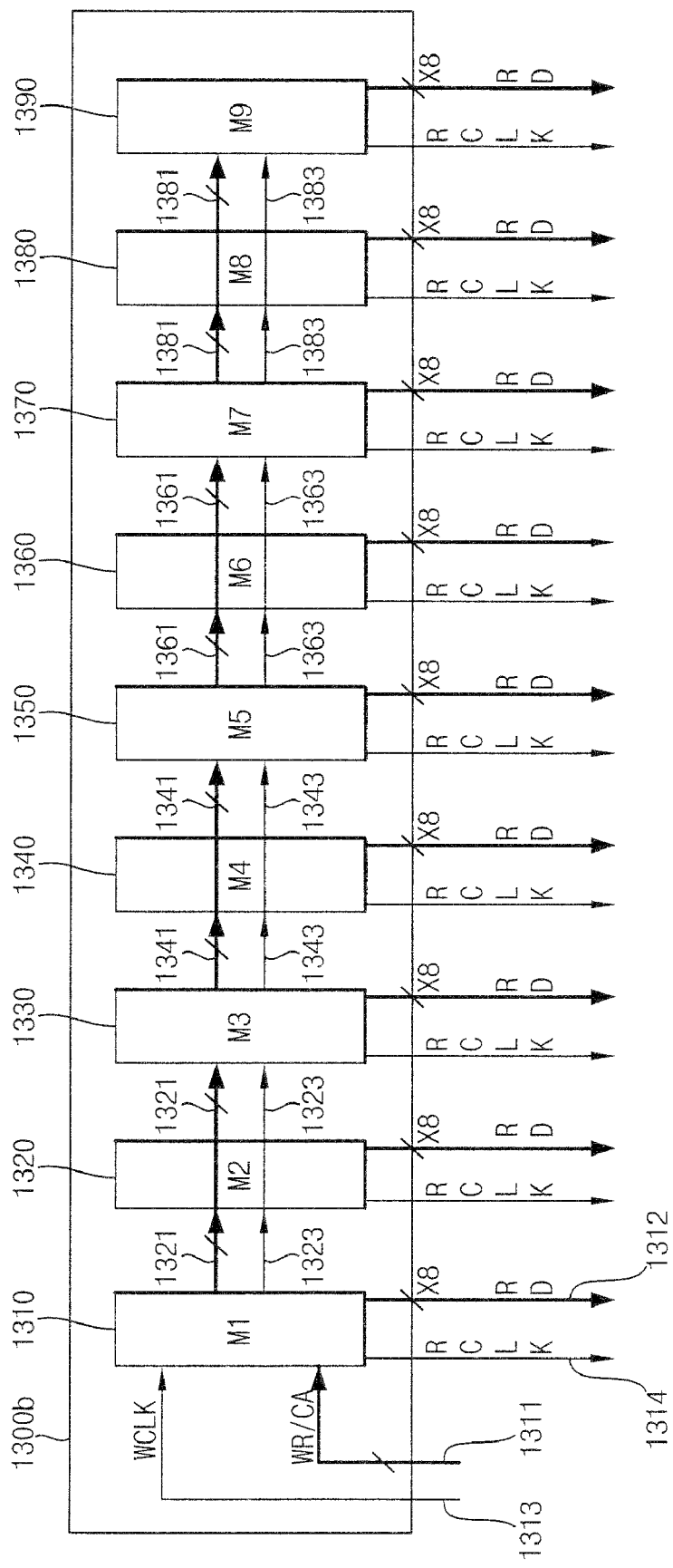

FIG. 13B is a block diagram illustrating a memory module 1300b in which write data and a command/address signal are transmitted through a common bus according to another embodiment.

In FIG. 13B, the memory device 1310 transfers the write data and the command/address signal to the memory devices 1320 and 1330 through a common IWR/CA bus 1321, and thus the number of pins of the memory module may be reduced. In addition, the memory device 1330 transfers the write data and the command/address signal, which were received from the memory device 1310, to the memory devices 1340 and 1350 through a common IWR/CA bus 1341, and thus the number of the pins of the memory module may be reduced. In this way, the memory device 1370 eventually transfers the transferred write data and the command/address signal to the memory devices 1380 and 1390 through a common IWR/CA bus 1381, and thus the number of the pins of the memory module may be reduced.

In addition, in the memory module 1300b, the write clock signal WCLK is transferred by a memory device to other memory devices through common internal clock buses 1323, 1343, 1363 and 1383, and thus the number of the pins of the memory module may be reduced.

That is, the memory devices 1310, 1330, 1350 and 1370 transfer the write data, the command/address signal and/or the write clock signal WCLK to other memory devices via common pins, and thus the number of the pins of the memory module may be reduced.

Figure 14:
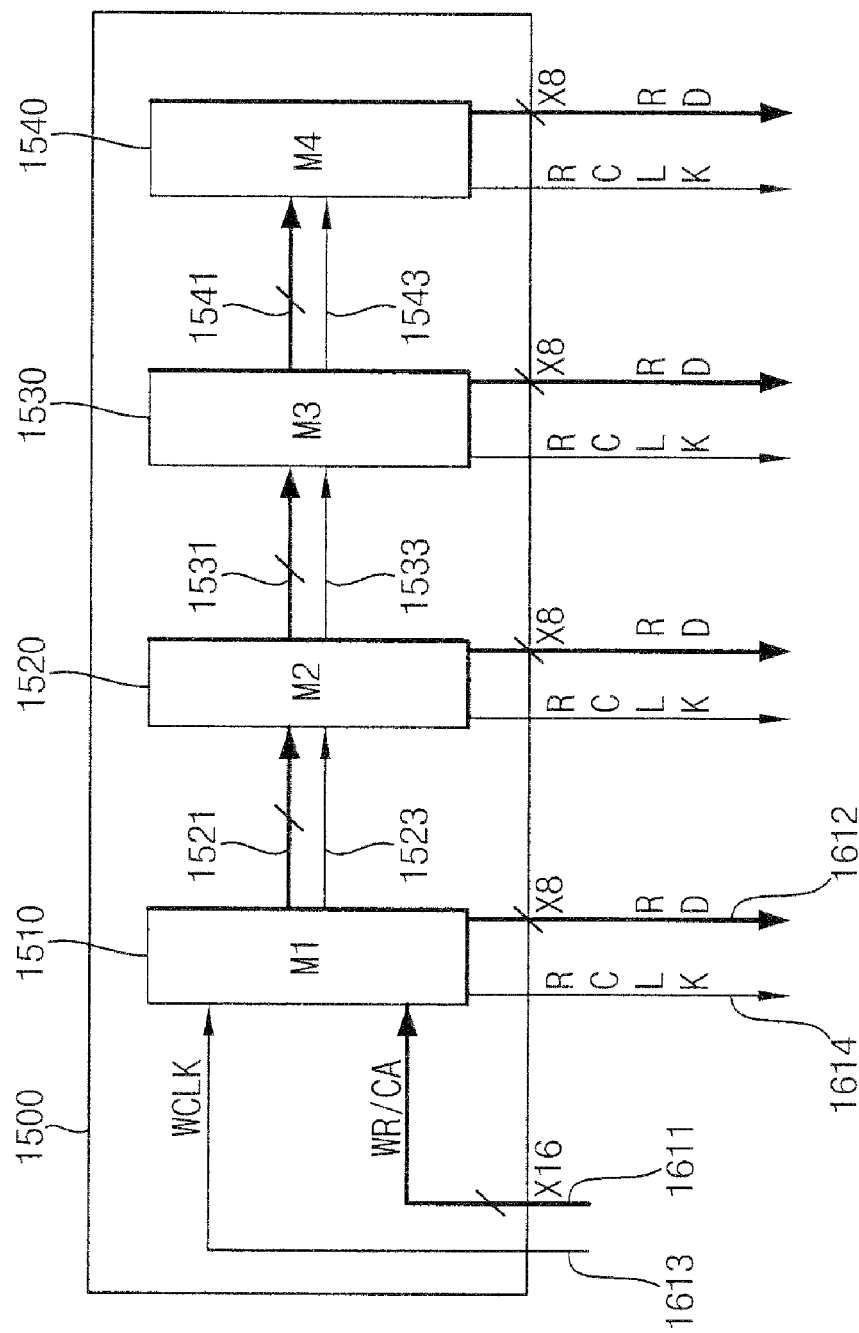
FIG. 14 is a block diagram illustrating a memory module in which write data and a command/address signal are transmitted through a common bus according to still another example embodiment.

FIG. 14 is a block diagram illustrating a memory module 1500 in which write data and a command/address signal are transmitted through a common bus according to another embodiment.

Referring to FIG. 14, a first memory device 1510 (M1) of a memory module 1500 having four memory devices receives a write clock WCLK, write data and a command/address signal from a memory controller (not shown) through a write clock bus 1613 (WCLK) and a WR/CA bus 1611, and transfers the received write clock WCLK, write data and a command/address signal to a memory device 1520 adjacent to the first memory device 1510. In this way, the write clock WCLK, the write data and the command/address signal received from the memory controller (not shown) to the first memory device 1510 are serially transferred to the second, third and fourth memory devices 1520, 1530 and 1540.

Figure 15:
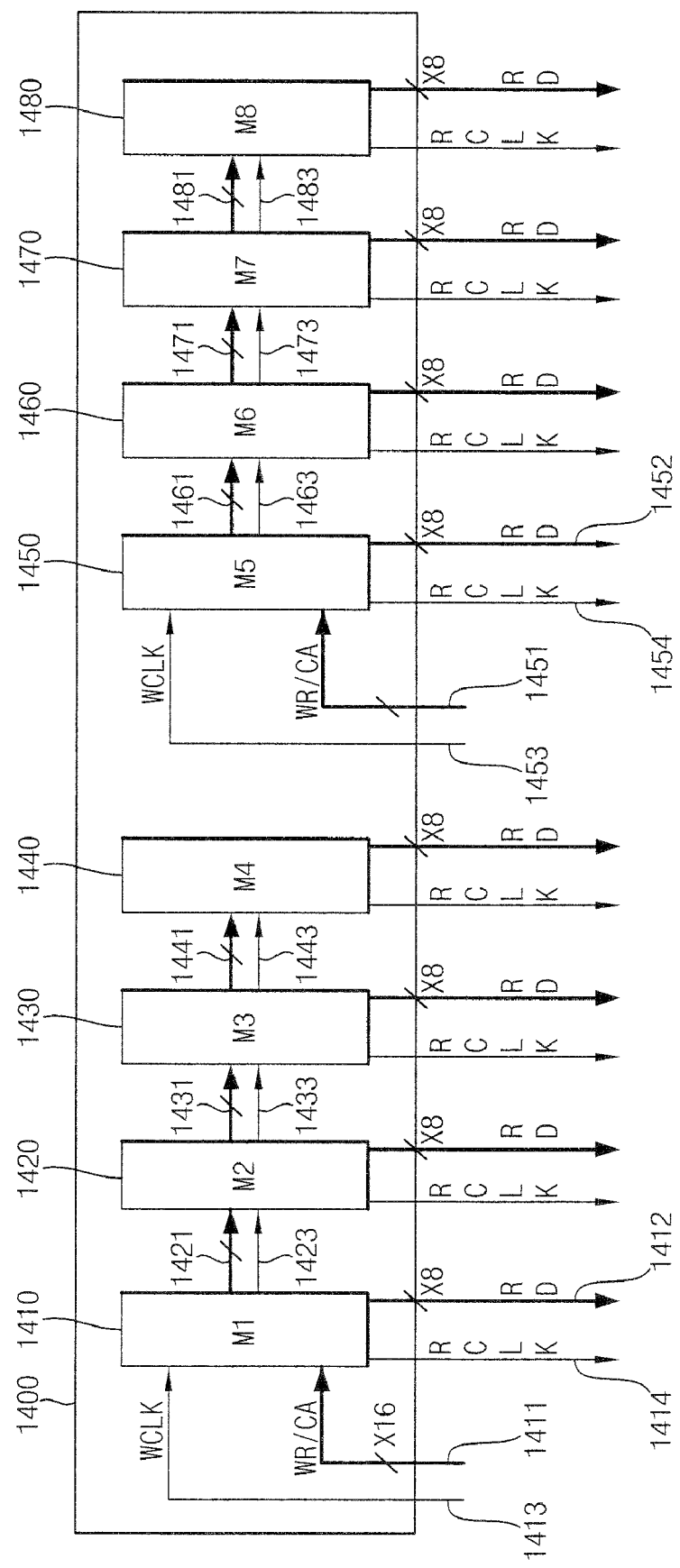
FIG. 15 is a block diagram illustrating a memory module in which write data and a command/address signal are transmitted through a common bus according to another embodiment.

FIG. 15 is a block diagram illustrating a memory module 1400 in which write data and a command/address signal are transmitted through a common bus according to another embodiment.

Referring to FIG. 15, first and fifth memory devices 1410 (M1) and 1450 (M5) of the eight memory devices of the memory module 1400 receive a write clock WCLK, write data and a command/address signal from a memory controller (not shown) through a write clock bus 1413 (WCLK) and a WR/CA bus 1411, and transfers the received write clock WCLK, write data and a command/address signal to memory devices 1420 (M2) and 1460 (M6) respectively adjacent to the first and the fifth memory devices 1410 and 1450.

In this way, the write clock WCLK, the write data and the command/address signal output from the memory controller (not shown) are serially transferred to the first, second, third and fourth memory devices 1410, 1420, 1430 and 1440, and are serially transferred to the fifth, sixth, seventh and eighth memory devices 1450, 1460, 1470 and 1480.

Figure 16:
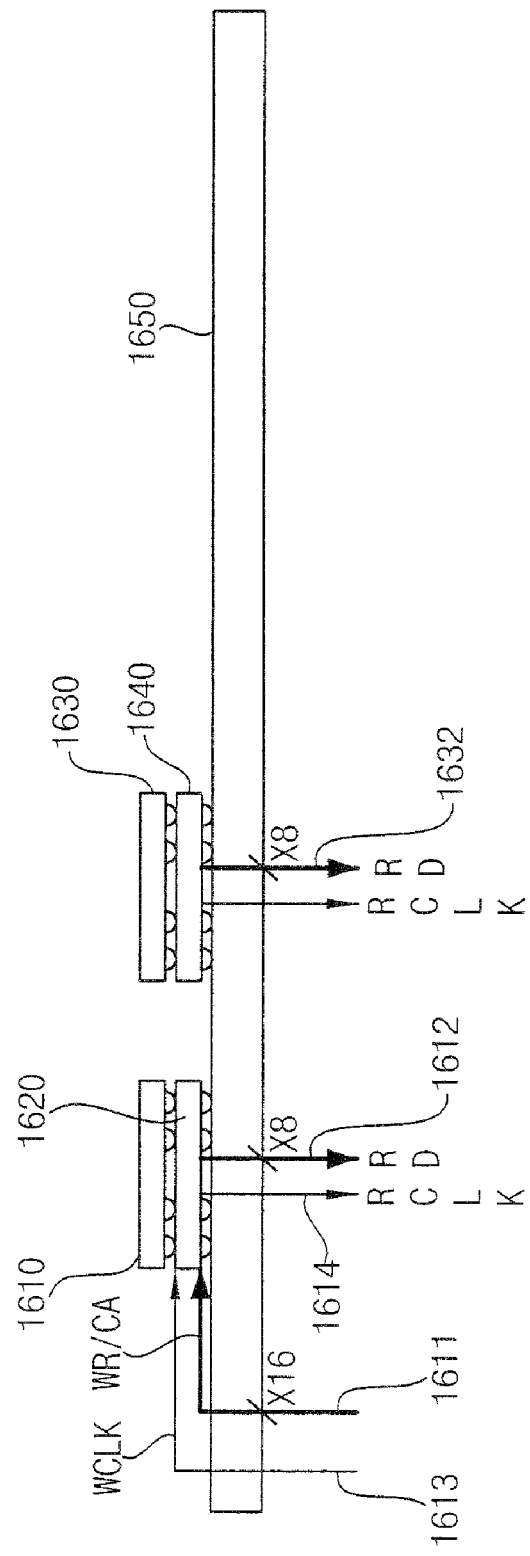
FIG. 16 is a schematic diagram illustrating a memory module having memory devices with a stack structure according to another embodiment.

FIG. 16 is a schematic diagram illustrating a memory module 1650 having memory devices with a stack structure according to another embodiment. In the memory system of FIG. 16a, a read data bus and a write data bus are separated from each other. The write data bus is merged with a command/address bus. The memory module of FIG. 16 may be applied to a die stack or a package stack.

Referring to FIG. 16, a first memory device 1620 of a first stack receives a command/address signal and write data from the memory controller (not shown) through a WR/CA bus 1611, and transfers the received command/address signal and write data to a second memory device 1610 disposed on the first memory device 1620. In addition, the first memory device 1620 transfers the command/address signal and the write data to a third memory device 1640 of a second stack through an internal WR/CA bus (not shown). The third memory device 1640 transfers the command/address signal and the write data to a fourth memory device 1630 disposed on the third memory device 1640.

In a similar way, a write clock signal WCLK is transferred to the first, second, third and fourth memory devices 1620, 1610, 1640 and 1630. Specifically, the first memory device 1620 receives the write clock signal WCLK from a memory controller (not shown) through a write clock bus 1613 (WCLK), and transfers the write clock signal WCLK to the second memory device 1610 disposed on the first memory device 1620. In addition, the first memory device 1620 transfers the write clock signal WCLK to the third memory device 1640 of the second stack through an internal write clock bus IWCLK (not shown). The third memory device 1640 transfers the write clock signal WCLK to the fourth memory device 1630 disposed on the third memory device 1640.

The data read from the second and fourth memory devices 1610 and 1630 respectively disposed on the first and third memory devices 1620 and 1640 are respectively transferred to the first and the third memory devices 1620 and 1640 in response to a read clock signal 1614 (RCLK), and are output to the memory controller (not shown) through data buses 1612 and 1632 (RD).

The memory device of FIG. 16 may have the internal blocks of the memory device of FIG. 11.

According to the above-described memory modules and memory systems, a memory controller is coupled to multiple memory devices via point-to-point connection. A repeater is implemented inside at least one memory device. The memory controller provides a command/address signal to at least one specific memory device instead of all memory devices in a memory module, and the specific memory device transfers the command/address signal to other memory devices in the memory module. As a result, a capacitive loading effect due to connections to the command/address bus may be reduced. Thus, a desired signal integrity (SI) may be achieved when the above-described memory modules and memory systems are applied to a memory system having an operating clock frequency higher than one GHz.

In addition, the command/address bus may be merged with the write bus so that the number of pins of the memory modules is reduced.

While embodiments and their advantages have been described in detail, it should be understood that various changes, substitutions and alterations may be made herein without departing from the spirit and scope of the following claims.

What is claimed is:

1. A memory module comprising:
   a port configured to receive write data and command/address signals; and
   a plurality of memory devices including;
      a first set of the memory devices, each memory device of the first set coupled to the port; and
      a second set of the memory devices, each memory device of the second set configured to receive associated write data and associated command/address signals for the memory device through at least one of the other memory devices of the first set and the second set.

2. The memory module of claim 1, wherein:
   the first set includes a first memory device; and
   the second set includes a plurality of second memory devices, each second memory device coupled to the first memory device through an associated bus and configured to receive the associated write data and the associated command/address signals through the associated bus.

3. The memory module of claim 1, wherein:
   the first set includes a first memory device coupled to a common bus; and
   the second set includes a plurality of second memory devices, each second memory device coupled to the common bus and configured to receive the associated write data and the associated command/address signals through the common bus.

4. The memory module of claim 1, wherein:
   the first set includes a first memory device coupled to a plurality of common buses; and
   the second set includes a plurality of second memory devices, each second memory device coupled to an associated one of the common buses and configured to receive the associated write data and the associated command/address signals through the associated common bus such that at least one of the second memory devices is coupled to each common bus.

5. The memory module of claim 1, wherein:
   the first set includes a first memory device coupled to a first bus; and
   the second set includes a plurality of second memory devices, one second memory device coupled to the first memory device through the first bus and configured to receive the associated write data and the associated command/address signals through the first bus, each of the other second memory devices coupled to one of the second memory devices through a subsequent bus and configured to receive the associated write data and the associated command/address signals through the associated subsequent bus such that the first memory device and the second memory devices are coupled serially.

6. The memory module of claim 5, wherein:
   the first memory device is further coupled to a second bus; and
   the second set further includes a plurality of third memory devices, one third memory device coupled to the first memory device through the second bus and configured to receive the associated write data and the associated command/address signals through the second bus, each of the other third memory devices coupled to one of the third memory devices through a subsequent bus and configured to receive the associated write data and the associated command/address signals through the associated subsequent bus such that the first memory device and the third memory devices are coupled serially.

7. The memory module of claim 1, wherein:
   the first set includes a first memory device coupled to a plurality of first buses;
   the second set includes a plurality of second memory devices and a plurality of third memory devices, each second memory device coupled to the first memory device through the associated first bus and configured to receive the associated write data and the associated command/address signals through the associated first bus, each third memory device coupled to one of the second memory devices through an associated bus and configured to receive the associated write data and the associated command/address signals through the associated bus.

8. The memory module of claim 1, wherein:
   the first set includes a first memory device coupled to a plurality of common buses;
   the second set includes a plurality of subsets of memory devices, each subset coupled to the first memory device through the associated common bus, each memory device of the subset coupled to the associated common bus and configured to receive the associated write data and the associated command/address signals through the common bus.

9. The memory module of claim 1, wherein for each of the memory devices of the second set, the associated write data and the associated command/address signals include all of the write data and the command/address signals.

10. The memory module of claim 1, wherein for each of the memory devices of the second set, the associated write data and the associated command/address signals include only command/address signals and write data to be stored in the memory device or any memory device that receives its associated write data and its associated command/address signals through the memory device.

11. The memory module of claim 1, wherein the write data is ordered in time reversed from an order in time that the write data and the command/address signals and the associated write data and the associated command/address signals are to be received by the memory devices of the first and second sets, respectively.

12. The memory module of claim 1, wherein at least one memory device of the first set comprises a repeater configured to transfer the associated write data and the associated command/address signals to at least one of the memory devices of the second set.

13. The memory module of claim 1, wherein the command/address signals include packet data including at least one of a read command, a write command, and an address.

14. The memory module of claim 1, wherein each of the memory devices of the first and second set includes a data port and transmits read data to a memory controller through the data port.

15. A memory module comprising:
a command/address port configured to receive command/address signals; and
a plurality of memory devices including;
    a first set of the memory devices, each memory device of the first set coupled to the command/address port; and
    a second set of the memory devices, each memory device of the second set configured to receive associated command/address signals through at least one of the other memory devices of the first set and the second set.

16. The memory module of claim 15, wherein:
the first set includes a first memory device; and
the second set includes a plurality of second memory devices, each second memory device coupled to the first memory device through an associated bus and configured to receive the associated command/address signals through the associated bus.

17. The memory module of claim 15, wherein:
the first set includes a first memory device coupled to a common bus; and
the second set includes a plurality of second memory devices, each second memory device coupled to the common bus and configured to receive the associated command/address signals through the common bus.

18. The memory module of claim 15, wherein:
the first set includes a first memory device coupled to a plurality of common buses; and
the second set includes a plurality of second memory devices, each second memory device coupled to an associated one of the common buses and configured to receive the associated command/address signals through the associated common bus such that at least one of the second memory devices is coupled to each common bus.

19. The memory module of claim 15, wherein:
the first set includes a first memory device coupled to a first bus; and
the second set includes a plurality of second memory devices, one second memory device coupled to the first memory device through the first bus and configured to receive the associated write data and the associated command/address signals through the first bus, each of the other second memory devices coupled to one of the second memory devices through a subsequent bus and configured to receive the associated write data and the associated command/address signals through the associated subsequent bus such that the first memory device and the second memory devices are coupled serially.

20. The memory module of claim 19, wherein:
the first memory device is further coupled to a second bus; and
the second set further includes a plurality of third memory devices, one third memory device coupled to the first memory device through the second bus and configured to receive the associated write data and the associated command/address signals through the second bus, each of the other third memory devices coupled to one of the third memory devices through a subsequent bus and configured to receive the associated write data and the associated command/address signals through the associated subsequent bus such that the first memory device and the third memory devices are coupled serially.

21. The memory module of claim 15, wherein:
the first set includes a first memory device coupled to a plurality of first buses;
the second set includes a plurality of second memory devices and a plurality of third memory devices, each second memory device coupled to the first memory device through the associated first bus and configured to receive the associated write data and the associated command/address signals through the associated first bus, each third memory device coupled to one of the second memory devices through an associated bus and configured to receive the associated command/address signals through the associated bus.

22. The memory module of claim 15, wherein:
the first set includes a first memory device coupled to a plurality of common buses;
the second set includes a plurality of subsets of memory devices, each subset coupled to the first memory device through the associated common bus, each memory device of the subset coupled to the associated common bus and configured to receive the associated command/address signals through the common bus.

23. The memory module of claim 15, wherein at least one memory device of the first set comprises a repeater configured to transfer the associated command/address signals to at least one of the memory devices of the second set.

24. The memory module of claim 15, wherein the command/address signals include packet data including at least one of a read command, a write command, and an address.

25. The memory module of claim 15, wherein each of the memory devices of the first and second set includes a data port and transmits read data to a memory controller and receive write data from the memory controller through the data port.

26. A memory system comprising:
a plurality of memory modules, each memory module including:
    a command/address port configured to receive command/address signals;
    a first set of memory devices, each memory device of the first set coupled to the command/address port; and
    a second set of memory devices, each memory device of the second set configured to receive associated command/address signals through at least one of the other memory devices of the first set and the second set;
wherein each of the memory devices of the first and second sets is coupled to a corresponding memory device of another memory module by an associated data bus.

27. The memory system of claim 26, further comprising a memory controller,
wherein at least one memory device of the first set of each memory module receives the associated command/address signals from the memory controller through the associated command/address port.

28. The memory system of claim 27, wherein for each memory module, the at least one memory device of the first set comprises a repeater configured to transfer the associated command/address signals to at least one other memory device within the memory module including the memory device.

29. The memory system of claim 27, wherein the memory modules include a first memory module and a second memory module, each memory device of the first and second memory modules includes a data port, each memory device of the first memory module exchanging data directly with the memory controller through a point-to-point connection, and each memory device of the second memory module exchanging data indirectly with the memory controller through a daisy chain connection via the corresponding memory device of the first module.

30. The memory module of claim 27, wherein the command/address signals include packet data including at least one of a read command, a write command, and an address.

31. The memory system of claim 26, wherein the memory modules are serially coupled to each other by the data busses.

32. The memory system of claim 26, wherein for each memory device coupled to a plurality of data buses, the memory device comprising a repeater configured to repeat data on one bus as data on another bus.

33. The memory system of claim 26, wherein the command/address port configured to further receive write data.

* * * * *

UNITED STATES PATENT AND TRADEMARK OFFICE
CERTIFICATE OF CORRECTION

| | |
|---|---|
| PATENT NO. | : 7,463,535 B2 |
| APPLICATION NO. | : 11/379345 |
| DATED | : December 9, 2008 |
| INVENTOR(S) | : Joo-Sun Choi |

Page 1 of 1

It is certified that error appears in the above-identified patent and that said Letters Patent is hereby corrected as shown below:

Column 9, line 42, the word "573," should read -- 573. --;
Column 9, line 52, the word "M1" should read -- M11 --.

Signed and Sealed this

Seventeenth Day of February, 2009

JOHN DOLL
*Acting Director of the United States Patent and Trademark Office*